(12) United States Patent
Kadoshima et al.

(10) Patent No.: US 8,293,632 B2
(45) Date of Patent: Oct. 23, 2012

(54) MANUFACTURING METHOD OF SEMICONDUCTOR DEVICE

(75) Inventors: Masaru Kadoshima, Tokyo (JP); Shinsuke Sakashita, Tokyo (JP); Takaaki Kawahara, Tokyo (JP); Jiro Yugami, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 386 days.

(21) Appl. No.: 12/755,058

(22) Filed: Apr. 6, 2010

(65) Prior Publication Data

US 2010/0279496 A1 Nov. 4, 2010

(30) Foreign Application Priority Data

Apr. 30, 2009 (JP) ................................. 2009-110663

(51) Int. Cl.
*H01L 21/3205* (2006.01)
(52) U.S. Cl. ......... 438/585; 438/199; 438/216; 438/591
(58) Field of Classification Search .................. 438/197, 438/199, 216, 217, 218, 224, 227, 228, 229, 438/585, 591
See application file for complete search history.

(56) References Cited

U.S. PATENT DOCUMENTS 7,863,127 B2 * 1/2011 Mise et al. .................... 438/216
2005/0280095 A1 * 12/2005 Nabatame et al. ............ 257/369
2009/0166749 A1 * 7/2009 Ichihara et al. ............... 257/369
2010/0009529 A1 * 1/2010 Taniguchi et al. ............ 438/591
2010/0038729 A1 * 2/2010 Eimori et al. ................. 257/411

OTHER PUBLICATIONS

T. Schram et al., "Novel Process to Pattern Selectively Dual Dielectric Capping Layers Using Soft-Mask Only," 2008 Symposium on VLSI Technology Digest of Technical Papers, pp. 44-45.
S. C. Song et al., "Highly manufacturable 45nm LSTP CMOSFETs Using Novel Dual High-k and Dual Metal Gate CMOS Integration," 2006 Symposium on VLSI Technology Digest of Technical Paper, pp. 16-17.

* cited by examiner

*Primary Examiner* — Kevin M Picardat
(74) *Attorney, Agent, or Firm* — McDermott Will & Emery LLP

(57) ABSTRACT

To improve productivity and performance of a CMISFET including a high-dielectric-constant gate insulating film and a metal gate electrode. An Hf-containing insulating film for a gate insulating film is formed over the main surface of a semiconductor substrate. A metal nitride film is formed on the insulating film. The metal nitride film in an nMIS formation region where an n-channel MISFET is to be formed is selectively removed by wet etching using a photoresist pattern on the metal nitride films a mask. Then, a threshold adjustment film containing a rare-earth element is formed. The Hf-containing insulating film in the nMIS formation region reacts with the threshold adjustment film by heat treatment. The Hf-containing insulating film in a pMIS formation region where a p-channel MISFET is to be formed does not react with the threshold adjustment film because of the existence of the metal nitride film. Then, after removing the unreacted threshold adjustment film and the metal nitride film, metal gate electrodes are formed in the nMIS formation region and the pMIS formation region.

19 Claims, 22 Drawing Sheets

MANUFACTURING METHOD OF SEMICONDUCTOR DEVICE

CROSS-REFERENCE TO RELATED APPLICATIONS

The disclosure of Japanese Patent Application No. 2009-110663 filed on Apr. 30, 2009 including the specification, drawings and abstract is incorporated herein by reference in its entirety.

BACKGROUND OF THE INVENTION

The present invention relates to manufacturing methods of semiconductor devices, and more particularly to a technique effectively applied to a manufacturing technology of a semiconductor device including a MISFET with a metal gate electrode.

A metal insulator semiconductor field effect transistor (MISFET, namely, MIS field-effect transistor, or MIS transistor) can be manufactured by forming a gate insulating film over a semiconductor substrate, forming a gate electrode over the gate insulating film, and forming source and drain regions by ion implantation.

In a complementary MISFET (CMISFET), gate electrodes are formed using materials with different work functions (for polysilicon, Fermi levels) so as to achieve a low threshold voltage in both of an n-channel MISFET and a p-channel MISFET, which is the so-called dual gate technique. That is, n-type impurities and p-type impurities are implanted into polysilicon films forming gate electrodes of the n-channel MISFET and p-channel MISFET. As a result, the work function (Fermi level) of the gate electrode material of the n-channel MISFET is brought close to the conduction band of silicon, and the work function (Fermi level) of the gate electrode material of the p-channel MISFET is brought close to the valence band of silicon, which achieves reduction in threshold voltage.

However, gate insulating films have recently been made thinner together with microfabrication of CMISFET elements. In use of a polysilicon film as a gate electrode, the influence of depletion of the gate electrode has not been negligible. For this reason, a technique is proposed in which a metal gate electrode is used as a gate electrode to suppress the depletion of the gate electrode.

Since the gate insulating film has been made thinner by microfabricating the CMISFET element, when using a thin silicon oxide film as a gate insulating film, electrons flowing through a channel of the MISFET tunnel through a barrier formed of the silicon oxide film to flow into the gate electrode. That is, the so-called tunnel current is generated. Another technique is proposed in which material having a dielectric constant higher than that of a silicon oxide film is used as a gate insulating film thereby to increase the physical thickness of a gate electrode even with the same capacity so as to reduce leak current.

Non-patent documents 1 and 2 disclose techniques regarding a CMOSFET using a metal gate electrode and a high-dielectric-constant gate insulating film.

RELATED ART DOCUMENTS

Non-Patent Documents

[Non-Patent Document 1]
T. Schram et al., including other 30 persons, "Novel Process To Pattern selectively Dual Dielectric Capping Layers Using Soft-Mask Only", "2008 Symposium on VLSI Technology Digest of Technical Papers", (USA), 2008, p. 44 to 45

[Non-Patent Document 2]
S. C. Song et al., including other 16 persons, "Highly Manufacturable 45 nm LSTP CMOSFETs Using Novel Dual High-k and Dual Metal Gate CMOS Integration" "2006 Symposium on VLSI Technology Digest of Technical Papers", (USA), 2006, p. 16 to 17

SUMMARY OF THE INVENTION

The studies performed by the inventors have shown the following.

The use of a metal gate electrode can solve the problems of depletion of the gate electrode, but results in an increased absolute value of threshold voltages at both of an n-channel MISFET and a p-channel MISFET as compared to the use of a polysilicon gate electrode. Thus, it is desirable that the threshold (or to reduce the absolute value of the threshold voltage) is lowered in application of the metal gate electrode. However, when the n-channel MISFET and the p-channel MISFET have the same structures of the metal gate electrode and the gate insulating film, reduction of the threshold of one of the n-channel and p-channel MISFETs conversely results in an increase of the threshold of the other.

For this reason, it is desirable that the respective threshold voltages of the n-channel and p-channel MISFETs can be independently controlled. Thus, different materials are selected for the respective metal gate electrodes of the n-channel MISFET and the p-channel MISFET. However, the use of the different metal-gate-electrode materials for the respective metal gate electrodes of the n-channel and p-channel MISFETs complicates the manufacturing process of a semiconductor device (gate electrode formation process), leading to a decrease in throughput and an increase in manufacturing cost of the semiconductor device.

In order to independently control the respective threshold voltages of the n-channel and p-channel MISFETs, it is effective to select different insulating materials for a gate insulating film of the n-channel MISFET and for a gate insulating film of the p-channel MISFET.

A Hf-based gate insulating film which is a high-dielectric-constant film containing Hf is excellent as a high-dielectric-constant film (high-k film) for a gate insulating film. When a rare-earth element (especially preferably, lanthanum) is introduced into the Hf-based gate insulating film of the n-channel MISFET, the threshold voltage of the n-channel MISFET can be lowered. In contrast, when a rare-earth element (especially, lanthanum) is introduced into the Hf-based gate insulating film of the p-channel MISFET, the threshold of the p-channel MISFET may be made higher. Thus, the rare-earth element (especially, lanthanum) is selectively introduced into the Hf-based gate insulating film of the n-channel MISFET, and further no rare-earth element (especially, lanthanum) is introduced into the Hf-based gate insulating film of the p-channel MISFET. Accordingly, the threshold of the n-channel MISFET can be lowered without increasing the absolute value of the threshold voltage of the p-channel MISFET.

The following process is proposed as means for selectively introducing the rare-earth element (especially, lanthanum) into the Hf-based gate insulating film of the n-channel MISFET without introducing any rare-earth element (especially, lanthanum) into the Hf-based gate insulating film of the p-channel MISFET.

A Hf-based gate insulating film, such as a HfSiON film, is formed over the entire main surface of a semiconductor substrate. A lanthanum oxide film is formed over the entire surface of the Hf-based gate insulating film. A photoresist film is formed over the lanthanum oxide film. A part of the lanthanum oxide film in a region for forming a p-channel MISFET is selectively removed by etching using the photoresist film as an etching mask, and then the photoresist film is removed. Thereafter, the heat treatment is performed to cause the Hf-based gate insulating film in the n-channel MISFET formation region to react with the lanthanum oxide film, so that lanthanum is introduced into the Hf-based gate insulating film. Since the lanthanum oxide film in the p-channel MISFET formation region is removed, no lanthanum is introduced into the Hf-based gate insulating film in the p-channel MISFET formation region. Thus, the lanthanum is selectively introduced into the Hf-based gate insulating film of the n-channel MISFET without introducing lanthanum into the Hf-based gate insulating film of the p-channel MISFET.

However, the inventors have found through the studies that such a process has the following problems. That is, when residues of the photoresist film remain on the lanthanum oxide film in removing the photoresist film on the lanthanum oxide film, the residues adversely affect the characteristics and reliability of the MISFET to be formed. The photoresist film needs to be completely removed without any residues when removing the photoresist film on the lanthanum oxide film. Thus, the use of an ammonia-hydrogen peroxide mixture (APM solution: mixture of ammonia, hydrogen peroxide, and water) is required to remove the photoresist film. The studies performed by the inventors, however, have shown the following. When the photoresist film is removed by using the APM solution, the Hf-based gate insulating film in the p-channel MISFET formation region is damaged by exposure to the APM solution, which adversely affects the characteristics and reliability of the MISFET.

Alternatively, another process is proposed in which a high-dielectric-constant gate insulating film and a metal gate electrode of a p-channel MISFET are formed after forming a high-dielectric-constant gate insulating film and a metal gate electrode of an n-channel MISFET. In this case, the manufacturing process becomes complicated, which leads to a decrease in throughput of the semiconductor device and an increase in manufacturing cost of the semiconductor device.

Accordingly, it is an object of the present invention to provide a technique which can improve the productivity of a semiconductor device including a CMISFET with a high-dielectric-constant gate insulating film and a metal gate electrode.

It is another object of the present invention to provide a technique which can improve the reliability of a semiconductor device including a CMISFET with a high-dielectric-constant gate insulating film and a metal gate electrode.

The above, other objects and novel features of the invention will become apparent from the description of the present specification and the accompanying drawings.

The outline of representative aspects of the invention disclosed in the present application will be briefly described below.

A manufacturing method of a semiconductor device according to a representative embodiment is to manufacture a semiconductor device which includes a first MISFET serving as one of an n-channel MISFET and a p-channel MISFET in a first region of a semiconductor substrate, and a second MISFET serving as the other of the n-channel MISFET and the p-channel MISFET in a second region of the semiconductor substrate. The manufacturing method includes the steps of: (a) forming a first insulating film containing Hf for a gate insulating film of each of the first and second MISFETs, in the first region and the second region of the semiconductor substrate; (b) forming a first metal nitride film over the first insulating film formed in the first region and the second region; and (c) removing the first metal nitride film in the first region, while leaving the first metal nitride film in the second region. The manufacturing method also includes the steps of: (d) after the step (c), forming a first metal-containing film containing a first metal element for reducing a threshold of the first MISFET, over the first insulating film in the first region and over the first metal nitride film in the second region; and (e) causing the first insulating film in the first region to react with the first metal-containing film by heat treatment. The manufacturing method further includes the steps of: (f) after the step (e), removing an unreacted part of the first metal-containing film not reacting in the step (e); (g) after the step (f), removing the first metal nitride film; and (h) after the step (g), forming a metal film over the first insulating film in the first region and the second region. The manufacturing method still further includes the step of (i) forming a first gate electrode for the first MISFET in the first region, and a second gate electrode for the second MISFET in the second region by patterning the metal film.

The effects obtained by the representative aspects of the invention disclosed in the present application will be briefly described below.

According to a representative embodiment of the invention, the productivity of the semiconductor device can be improved.

According to the representative embodiment of the invention, the reliability of the semiconductor device can also be improved.

DETAILED DESCRIPTION OF THE PREFERRED EMBODIMENTS

Figure 1:
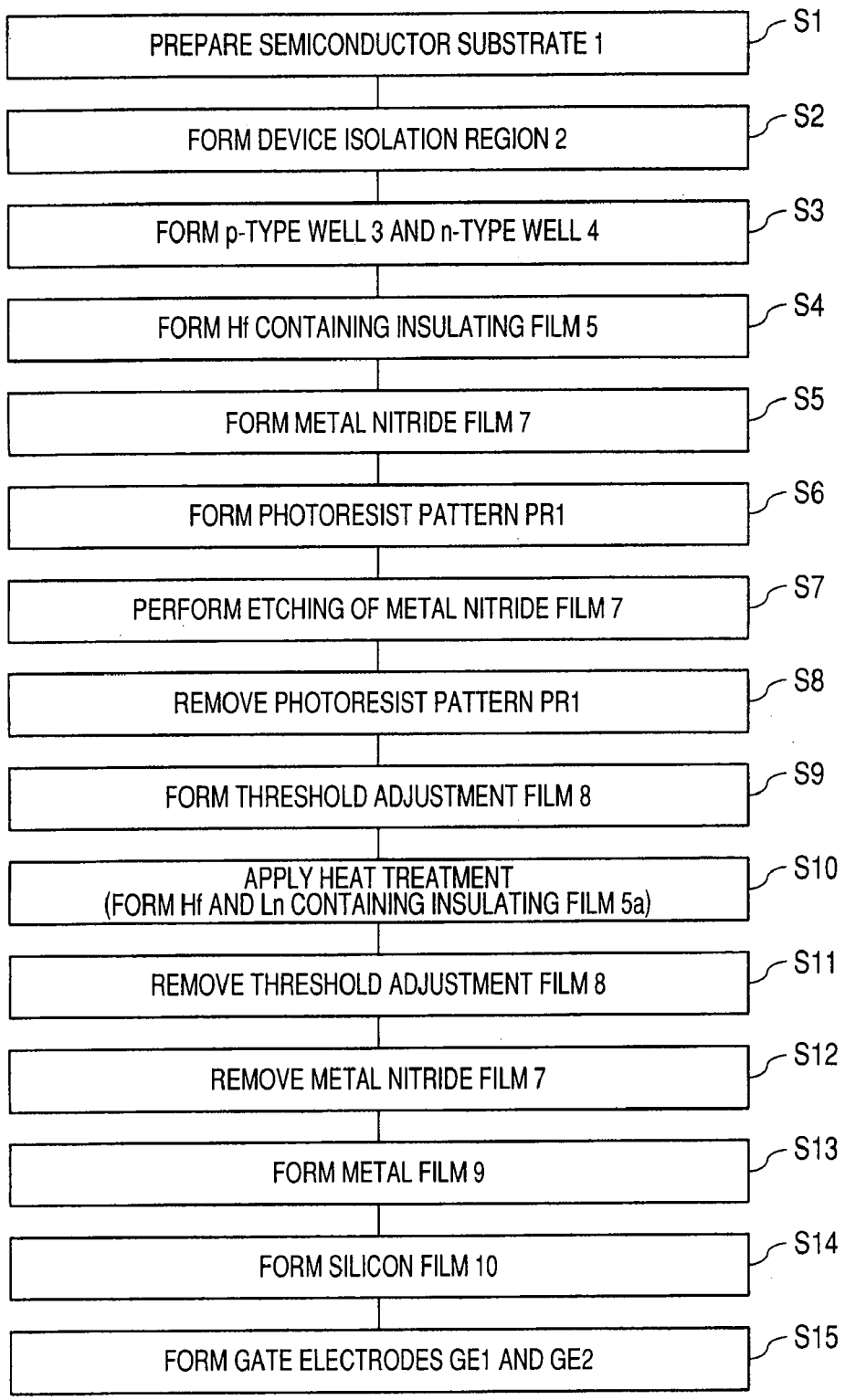
FIG. 1 is a manufacturing process flow chart showing parts of a manufacturing process of a semiconductor device according to one embodiment of the invention.

The description of the following preferred embodiments may be given by dividing the embodiments into sections or individual embodiments themselves for convenience, if necessary, but these embodiments are related to each other except when specified otherwise. One of the embodiments has a relationship with respect to the other so as to be a modified example of a part or all of the other, or a detailed part or a supplemental description of the other. Further, when referring to the number of components or the like (including the number of pieces, the numeral value, the amount, the range, and the like), the following embodiments are not limited to a specific value except when specified otherwise and except when clearly limited to a specific value otherwise in principle, and thus may have a value equal to or more than, or less than the specific value. In the embodiments below, components (including elemental steps or the like) are not necessarily essential except when specified otherwise and except when clearly considered essential in principle. Similarly, referring to the shape, positional relationship, and the like of the components or the like in the embodiments below, the invention may include the substantially approximate or similar shape and the like as those of the embodiments except when specified otherwise and unless otherwise clearly specified in principle. The same goes for the above-mentioned numeral values and ranges.

Now, the preferred embodiments of the invention will be described in detail below based on the accompanying drawings. In all drawings for explaining the embodiments, a member having the same function is designated by the same reference numeral, and thus the repeated description thereof will be omitted below. In the following embodiments, the description of the same or similar components will not be repeated in principle.

In the accompanying drawings used in the embodiments, hatching is omitted even in some cross-sectional views for easy understanding. Further, hatching is applied even to some plan views for easy understanding.

First Embodiment

A manufacturing process of a semiconductor device of this embodiment will be described below with reference to the accompanying drawings.

FIG. 1 is a manufacturing process flow chart showing parts of the manufacturing process of the semiconductor device according to one embodiment of the invention, specifically, the semiconductor device including a complementary metal insulator semiconductor field effect transistor (CMISFET). FIGS. 2 to 16 are cross-sectional views of main parts of the semiconductor device according to the embodiment of the invention, namely, the semiconductor device including a CMISFET during respective manufacturing steps.

Figure 2:
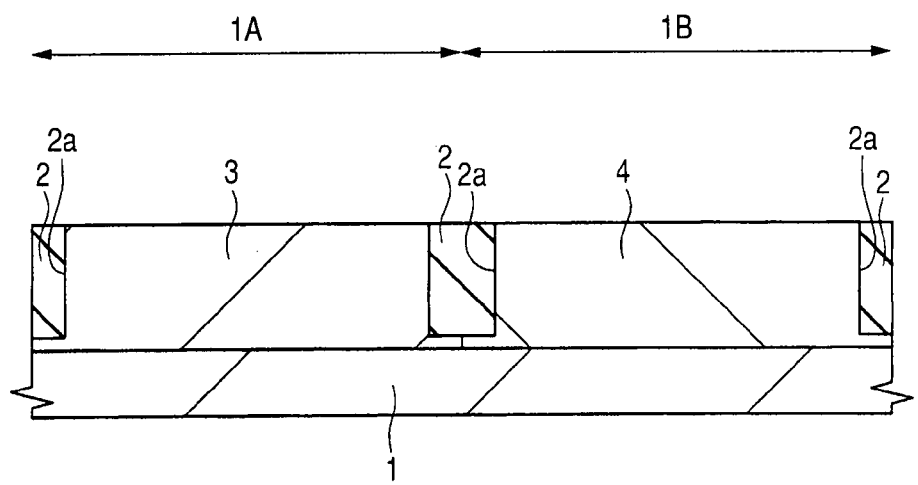
FIG. 2 is a cross-sectional view of a main part of the semiconductor device in a manufacturing step in the embodiment of the invention.

First, as shown in FIG. 2, a semiconductor substrate (semiconductor wafer) 1 made of p-type single crystal silicon and having a specific resistance of, for example, about 1 to 10 Ωcm is prepared (in step S1 shown in FIG. 1). The semiconductor substrate 1 over which the semiconductor device of this embodiment is formed includes an nMISFET formation region 1A over which an n-channel MISFET (metal insulator semiconductor field effect transistor) is formed, and a pMIS formation region 1B over which a p-channel MISFET is formed. Then, a device isolation region 2 is formed at the main surface of the semiconductor substrate 1 (in step S2 shown in FIG. 1). The device isolation region 2 is made of an insulator, such as silicon oxide, for example, by a shallow trench isolation (STI) method or a local oxidization of silicon (LOCOS) method, or the like. For example, the device isolation region 2 can be formed of an insulating film embedded in a slot (device isolation slot) 2a formed in the semiconductor substrate 1.

Then, a p-type well 3 is formed in a region of the semiconductor substrate 1 where the n-channel MISFET is to be formed (namely, nMIS formation region 1A), and an n-type well 4 is formed in another region of the substrate where the p-channel MISFET is to be formed (namely, pMIS formation region 1B) (in step S3 shown in FIG. 1). In step S3, the p-type well 3 is formed by ion-implanting p-type impurities, such as boron (B), and the n-type well 4 is formed by ion-implanting n-type impurities, such as phosphorus (P) or arsenic (As). Ion implantation for adjusting a threshold of the MISFET to be formed later (which is the so-called channel dope ion implantation) can be carried out into an upper layer part of the semiconductor substrate 1 if necessary, before or after the formation of the p-type well 3 and the n-type well 4.

Then, a natural oxide film on the surface of the semiconductor substrate 1 is removed, for example, by wet etching using hydrofluoric acid (HF) aqueous solution thereby to clean (wash) the surface of the semiconductor substrate 1. Thus, the surface (silicon surface) of the semiconductor substrate 1 (p-type well 3 and n-type well 4) is exposed.

Figure 3:
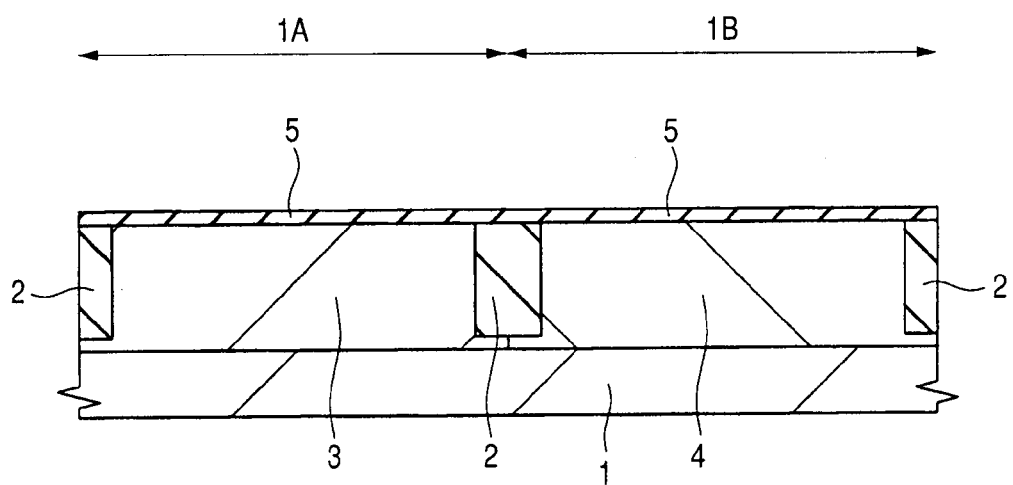
FIG. 3 is a cross-sectional view of a main part of the semiconductor device in a manufacturing step following the step shown in FIG. 2.

Then, as shown in FIG. 3, an Hf-containing insulating film (first insulating film) 5 for a gate insulating film is formed over the surface of the semiconductor substrate 1 (that is, on the surfaces of the p-type well 3 and the n-type well 4) (in step S4 shown in FIG. 1). The Hf-containing insulating film 5 is formed over the entire main surface of the semiconductor substrate 1, and thus formed at both nMIS formation region 1A and pMIS formation region 1B.

The Hf-containing insulating film 5 is an insulating film containing Hf. The Hf-containing insulating film 5 is comprised of an insulating material containing Hf (hafnium), and preferably, can be a HfSiON film (hafnium silicon oxynitride film), a HfON film (hafnium oxynitride film), or a HfO film (hafnium oxide film, typified by a $HfO_2$ film). Thus, the Hf-containing insulating film 5 preferably contains oxygen (O) in addition to hafnium (Hf). The HfSiON film is an insulating film comprised of hafnium (Hf), silicon (Si), oxygen (O), and nitrogen (N). The HfON film is an insulating film comprised of hafnium (Hf), oxygen (O), and nitrogen (N). The HfO film is an insulating film comprised of hafnium (Hf), and oxygen (O).

In a case where the Hf-containing insulating film 5 is an Hf SiON film, a HfSiO film is first deposited by an atomic layer deposition (ALD) method or a chemical vapor deposition (CVD) method. Then, the HfSiO film is nitrided by a nitriding process, such as a plasma nitriding process (that is, the HfSiO film is nitrided to be converted into an HfSiON film), so that the HfSiON film can be formed. After the nitriding process, the heat treatment may be performed under an inactive or oxidizing atmosphere in some cases.

In a case where the Hf-containing insulating film 5 is an HfON film, a HfO film (typified by the $HfO_2$ film) is deposited by using the ALD method or CVD method, and then nitrided by the plasma nitriding process (that is, to convert the HfO film into the HfON film), so that the HfON film can be formed. After the nitriding process, the heat treatment may be performed under an inactive or oxidizing atmosphere in some cases.

In a case where the Hf-containing insulating film 5 is an HfO film (typified by the $HfO_2$ film), the HfO film (typified by the $HfO_2$ film) may be deposited using the ALD method or CVD method, which does not need the nitriding process.

The Hf-containing insulating film 5 can have a thickness of, for example, about 0.5 to 2 nm.

The Hf-containing insulating film 5 can be directly formed on the surface (silicon surface) of the semiconductor substrate 1 (p-type well 3 and n-type well 4). More preferably, in step S4, before forming the Hf-containing insulating film 5, a thin silicon oxide film (not shown) is formed as an interface layer on the surface (silicon surface) of the semiconductor substrate 1 (p-type well 3 and n-type well 4), and then the Hf-containing insulating film 5 is formed on the silicon oxide film. The reason for forming the silicon oxide film is that a $SiO_2$/Si structure is provided at an interface between the gate insulating film and the semiconductor substrate so as to decrease the number of defects, such as traps, to the same degree as that in an $SiO_2$ gate insulating film (gate insulating film made of silicon oxide), thereby improving a driving capacity and reliability. The silicon oxide film can be formed using a thermal oxidation method or the like. The silicon oxide film is thin, and can preferably have a thickness of 0.3 to 1 nm, for example, about 0.6 nm.

Figure 4:
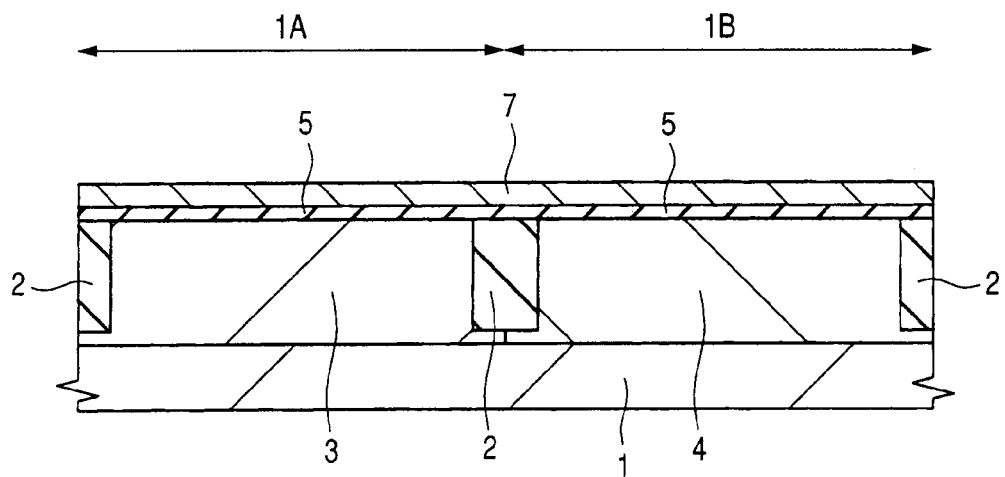
FIG. 4 is a cross-sectional view of a main part of the semiconductor device in a manufacturing step following the step shown in FIG. 3.

Then, as shown in FIG. 4, a metal nitride film 7 is formed over the main surface of the semiconductor substrate 1, that is, on the Hf-containing insulating film 5 (in step S5 shown in FIG. 1).

In step S5, the metal nitride film 7 is formed over the entire main surface of the semiconductor substrate 1, and thus on the Hf-containing insulating film 5 in both nMIS formation region 1A and pMIS formation region 1B. The metal nitride film 7 is preferably a titanium nitride (TiN) film, a hafnium nitride (HfN) film, or a zirconium nitride (ZrN) film. Among them, the metal nitride film 7 is more preferably the titanium nitride (TiN) film. The metal nitride film 7 can be formed by sputtering or the like, and can preferably have a thickness of about 5 to 20 nm.

Figure 5:
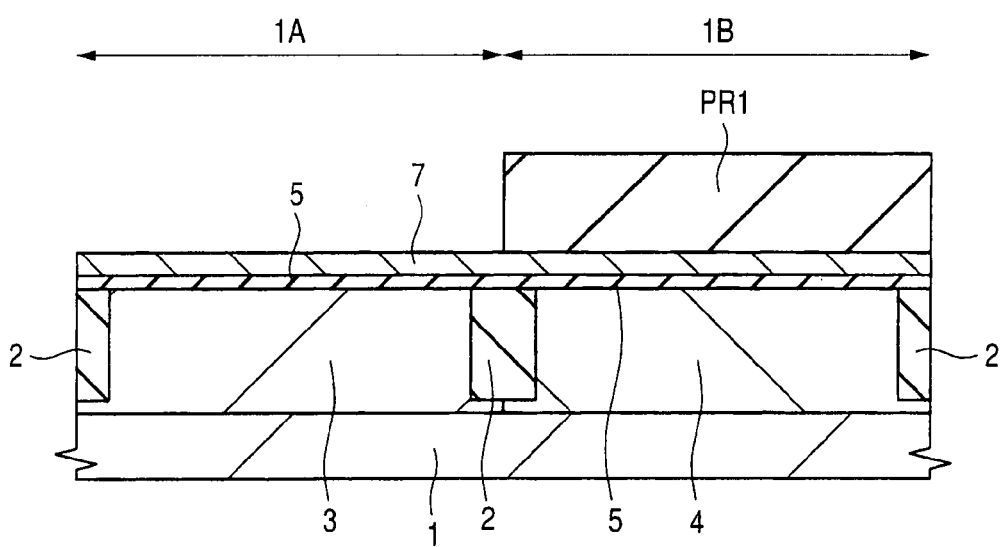
FIG. 5 is a cross-sectional view of a main part of the semiconductor device in a manufacturing step following the step shown in FIG. 4.

Then, as shown in FIG. 5, a photoresist film is applied over the main surface of the semiconductor substrate 1, that is, on the metal nitride film 7, exposed to light, and developed, so that a photoresist pattern (resist pattern) PR1 is formed as a resist pattern (in step S6 shown in FIG. 1).

The photoresist pattern PR1 is formed on the metal nitride film 7 in the pMIS formation region 1B, but not formed in the nMIS formation region 1A. Thus, the metal nitride film 7 in the pMIS formation region 1B is covered with the photoresist pattern PR1, and the metal nitride film 7 in the nMIS formation region 1A is exposed without being covered with the photoresist pattern PR1. The photoresist pattern PR1 is formed on the metal nitride film 7. A developer for developing the photoresist film contacts the metal nitride film 7, but does not contact the Hf-containing insulating film 5 covered with the metal nitride film 7, so that the Hf-containing insulating film 5 is not damaged by the developer.

Figure 6:
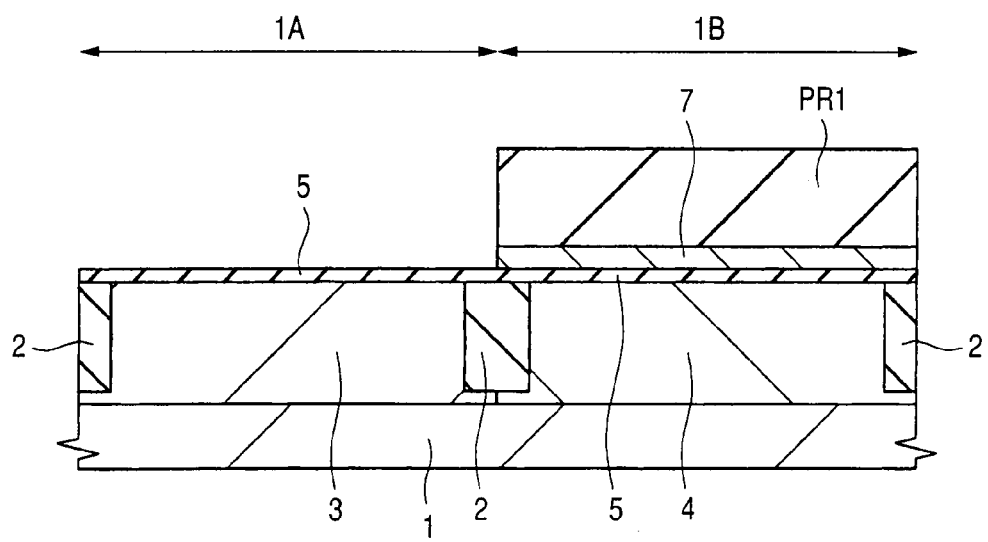
FIG. 6 is a cross-sectional view of a main part of the semiconductor device in a manufacturing step following the step shown in FIG. 5.

Then, the metal nitride film 7 is subjected to wet etching using the photoresist pattern PR1 as an etching mask (in step S7 shown in FIG. 1). In the wet etching process in step S7, as shown in FIG. 6, the metal nitride film 7 in the nMIS formation region 1A is removed by etching. In contrast, the metal nitride film 7 in the pMIS formation region 1B is covered with the photoresist pattern PR1, and thus remains without being etched. Thus, one part of the Hf-containing insulating film 5 in the nMIS formation region 1A is exposed, and the other part of the Hf-containing insulating film 5 in the pMIS formation region 1B remains while being covered with the metal nitride film 7 (that is, without being exposed). An etching solution used in the wet etching process of the metal nitride film 7 in step S7 contains hydrogen peroxide ($H_2O_2$) without ammonia ($NH_3$) and hydrofluoric acid (HF).

The studies performed by the inventors have shown that unlike this embodiment, when exposing a part of the Hf-containing insulating film 5 by wet etching using an ammonia-hydrogen peroxide mixture (APM) solution (which contains a mixture of ammonia, hydrogen peroxide, and water) or hydrofluoric acid, as an etching solution, the exposed part of the Hf-containing insulating film 5 may be damaged by the APM solution or hydrofluoric acid. This is because the Hf-containing insulating film 5 has low resistance to the APM solution or hydrofluoric acid.

In contrast, in this embodiment, the Hf-containing insulating film 5 of the nMIS formation region 1A is exposed in the wet etching process of the metal nitride film 7 at step S7. However, the wet etching process of the metal nitride film 7 in step S7 does not employ both the APM solution and hydrofluoric acid. Specifically, the wet etching process of the metal nitride film 7 in step S7 uses the etching solution containing hydrogen peroxide ($H_2O_2$) without any one of ammonia and hydrofluoric acid. Thus, etching damage to the Hf-containing insulating film 5 in the nMIS formation region 1A can be suppressed or prevented.

That is, as the material for the metal nitride film 7, is selected a material that can be removed without using any one of the APM solution and the hydrofluoric acid, while little causes etching damages to the Hf-containing insulating film 5. As such a material, metal nitride is preferable, and especially, titanium nitride (TiN), hafnium nitride (HfN), or zirconium nitride (ZrN) is more preferable.

Figure 7:
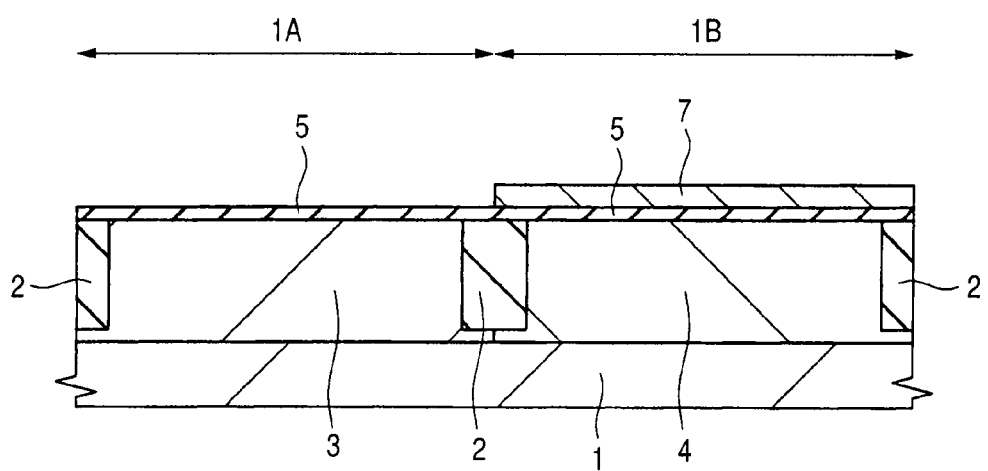
FIG. 7 is a cross-sectional view of a main part of the semiconductor device in a manufacturing step following the step shown in FIG. 6.

Then, as shown in FIG. 7, the photoresist pattern PR1 is removed (in step S8 shown in FIG. 1). In the process of removing the photoresist pattern PR1 in step S8, the photoresist pattern PR1 is removed using organic solvent or the like without using any one of the APM solution and hydrofluoric acid.

Unlike this embodiment, when using the APM solution in the removing process of the photoresist pattern PR1, the photoresist pattern PR1 can be removed without leaving the residue of the photoresist pattern PR1. However, the inventors have found through their studies that when the photoresist pattern PR1 is removed by the APM solution, the part of the Hf-containing insulating film 5 in the nMIS formation region 1A exposed to the APM solution may be damaged.

Thus, in this embodiment, in the removing process of the photoresist pattern PR1 in step S8, the organic solvent or the like is used instead of the APM solution to remove the photoresist pattern PR1. This process can suppress or prevent the damage to the Hf-containing insulating film 5 in the nMIS formation region 1A in removing the pattern PR1 in step S8. Instead, the residues of the photoresist pattern PR1 can remain on the metal nitride film 7. The residues can be removed together with the metal nitride film 7 as an underlayer in removing the metal nitride film 7 by wet etching in step S12 to be described later, which can prevent the adverse affects on the performance or reliability of the MISFET formed. Even when the residues of the resist pattern PR1 remain on the metal nitride film 7, the residues can be prevented from adversely affecting the MISFET in a heat treatment in step S10 to be described later by the intervention of the metal nitride film 7 as a reaction barrier layer between the residues and the Hf-containing insulating film 5.

Figure 8:
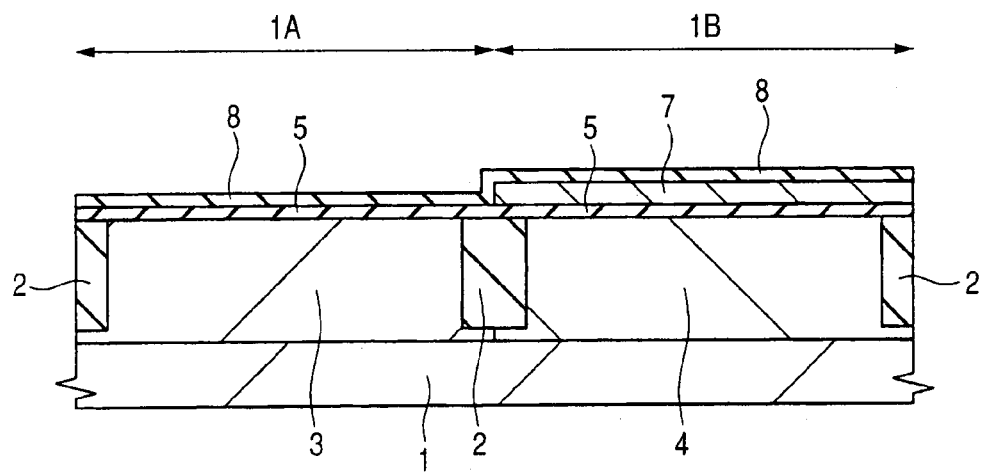
FIG. 8 is a cross-sectional view of a main part of the semiconductor device in a manufacturing step following the step shown in FIG. 7.

Then, as shown in FIG. 8, a threshold adjustment film (first metal-containing film) 8 is formed over the main surface of the semiconductor substrate 1 (in step S9 shown in FIG. 1). The part of the metal nitride film 7 in the nMIS formation region 1A is removed and the other part of the metal nitride film 7 in the pMIS formation region 1B remain in the wet etching process in the above step S7. In step S9, the threshold adjustment film 8 is formed on the Hf-containing insulating film 5 in the nMIS formation region 1A, and on the metal nitride film 7 in the pMIS formation region 1B. Thus, in the nMIS formation region 1A, the threshold adjustment film 8 is in contact with the Hf-containing insulating film 5, and in the pMIS formation region 1B, the threshold adjustment film 8 is not in contact with the Hf-containing insulating film 5 with the metal nitride film 7 intervening therebetween.

The threshold adjustment film 8 contains a metal element (first metal element), namely, a rare-earth element (preferably, La) to be introduced into the Hf-based gate insulating film of the n-channel MISFET (n-channel MISFET Qn to be described later) so as to decrease the absolute value of the threshold of the n-channel MISFET (corresponding to the n-channel MISFET Qn to be described later) to be formed in the nMIS formation region 1A.

Thus, the threshold adjustment film 8 contains the rare-earth element, preferably, La (lanthanum). Since a metal oxide film is preferable as the threshold adjustment film 8, the threshold adjustment film 8 is preferably a rare-earth oxide film (oxidized rare-earth film), and especially preferably a lanthanum oxide film (typified by $La_2O_3$ film as the lanthanum oxide film). The threshold adjustment film 8 can be formed by the sputtering or ALD method, and can have a thickness (thickness of deposited film) of about 1 nm.

In the present application, rare earthes or rare-earth elements include lanthanoid elements from lanthanum (La) to lutetium (Lu), and additionally scandium (Sc) and yttrium (Y). The rare-earth element contained in the threshold adjustment film 8 is hereinafter referred to as a "Ln". The gate insulting film containing Hf is hereinafter referred to as a "Hf-based gate insulating film".

Then, heat treatment is applied to the semiconductor substrate 1 (in step S10 shown in FIG. 1). The heat treatment process in step S10 can be performed at a heat treatment temperature in a range of 600 to 1000° C. under inert gas atmosphere. The Hf-containing insulating film 5 reacts with the threshold adjustment film 8 in the nMIS formation region 1A by the heat treatment in step S10. That is, the heat treatment process in step S10 introduces (diffuses) the rare-earth element Ln (especially, preferably La) included in the threshold adjustment film 8 into the Hf-containing insulating film 5.

In the heat treatment process at step S10, the threshold adjustment film 8 and the Hf-containing insulating film 5 are in contact with each other in the nMIS formation region 1A, and thus react with each other, so that the rare-earth element Ln of the threshold adjustment film 8 (especially preferably, Ln=La) is introduced (diffused) into the Hf-containing insulating film 5. In contrast, in the pMIS formation region 1B, the threshold adjustment film 8 and the Hf-containing insulating film 5 are not in contact with each other with the metal nitride film 7 intervening therebetween. The threshold adjustment film 8 does not react with the Hf-containing insulating film 5, so that the rare-earth element Ln of the threshold adjustment film 8 is not introduced (diffused) into the Hf-containing insulating film 5 in the region 1B.

Figure 9:
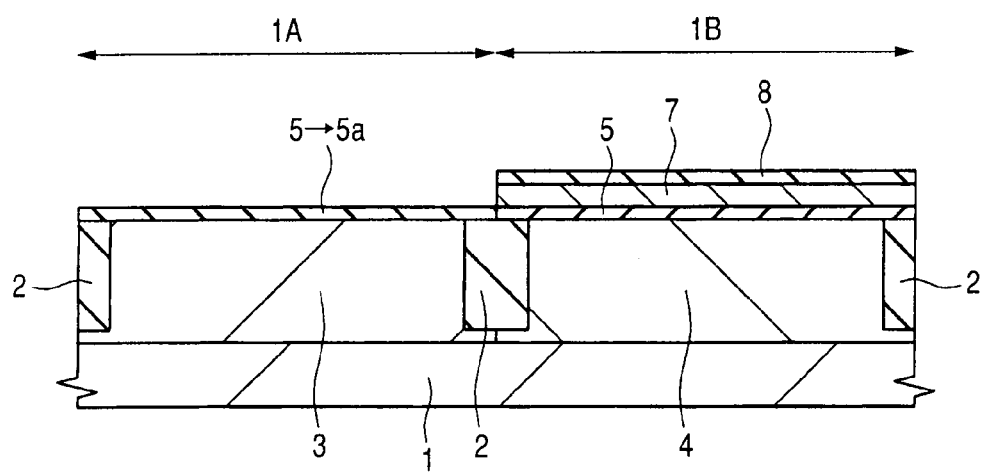
FIG. 9 is a cross-sectional view of a main part of the semiconductor device in a manufacturing step following the step shown in FIG. 8.

In the heat treatment in step S10 as shown in FIG. 9, a "Hf and Ln containing insulating film 5a" is formed by allowing the threshold adjustment film 8 to react (mix) with the Hf-containing insulating film 5 in the nMIS formation region 1A. That is, in the nMIS formation region 1A, the rare-earth element (especially preferably, La) of the threshold adjustment film 8 is introduced into the Hf-containing insulating film 5, so that the Hf-containing insulating film 5 is converted into Hf and Ln containing insulating film 5a. The rare-earth element contained in the threshold adjustment film 8 is designated as Ln. For example, when the threshold adjustment film 8 is a lanthanum oxide film, Ln is La (Ln=La). When the threshold adjustment film 8 is an yttrium oxide film, Ln is Y (Ln=Y).

The Hf and Ln containing insulating film 5a is made of an insulating material containing Hf (hafnium) and the rare-earth element Ln (especially preferably, Ln=La). The rare-earth element included in the Hf and Ln containing insulating film 5a is the same as the rare-earth element Ln included in the threshold adjustment film 8. Thus, when the Hf-containing insulating film 5 is a HfSiON film, the Hf and Ln containing insulating film 5a is a HfLnSiON film (in the case of Ln=La, a HfLaSiON film). When the Hf-containing insulating film 5 is a HfON film, the Hf and Ln containing insulating film 5a is a HfLnON film (in the case of Ln=La, a HfLaON film). When the Hf-containing insulating film 5 is a HfO film (typified by a $HfO_2$ film), the Hf and Ln containing insulating film 5a is a HfLnO film (in the case of Ln=La, a HfLaON film).

The HfLnSiON film is an insulating film comprised of hafnium (Hf), a rare-earth element Ln (especially preferably, Ln=La), silicon (Si), oxygen (O), and nitrogen (N). The HfLnON film is an insulating film comprised of hafnium (Hf), a rare-earth element Ln (especially preferably, Ln=La), oxygen (O), and nitrogen (N). The HfLnO film is an insulating film comprised of hafnium (Hf), a rare-earth element Ln (especially preferably, Ln=La), and oxygen (O).

The threshold adjustment film 8 is preferably a rare-earth oxide film (especially preferably, lanthanum oxide film) as described above, and contains oxygen (O) in addition to the rare-earth element Ln. Further, the Hf-containing insulating film 5 also contains oxygen (O). The Hf and Ln containing insulating film 5a contains oxygen (O) regardless of whether the oxygen (O) of the threshold adjustment film 8 is introduced into the Hf-containing insulating film 5 by the heat treatment in step S10. Actually, not only the rare-earth element Ln of the threshold adjustment film 8, but also the oxygen (O) of the film 8 is introduced into the Hf-containing insulating film 5 thereby to form the Hf and Ln containing insulating film 5a.

In contrast, in the pMIS formation region 1B as shown in FIG. 9, the Hf-containing insulating film 5 does not react with the metal nitride film 7 and the threshold adjustment film 8, and remains as it is. Thus, even after the heat treatment in step S10, the Hf-containing insulating film 5 in the pMIS formation region 1B remains without containing the rare-earth element Ln. That is, as the material for the metal nitride film 7, a material is selected which is stable even at the temperature of the heat treatment in step S10 and which is difficult to react with the Hf-containing insulating film 5. Such a material is preferably metal nitride, and more preferably, titanium nitride (TiN), hafnium nitride (HfN), or zirconium nitride (ZrN). Thus, the Hf-containing insulating film 5 can be prevented from reacting with the metal nitride film 7 in the heat treatment process in step S10.

As mentioned above, in the above step S4, a thin silicon oxide film (not shown) is formed over the surface (silicon surface) of the semiconductor substrate 1 (p-type well 3 and n-type well 4) as an interface layer before forming the Hf-containing insulating film 5. In the case where the Hf-containing insulating film 5 is formed on the silicon oxide film, preferably, in the heat treatment at step S10, the reaction between the Hf-containing insulating film 5 and the silicon oxide film is suppressed to leave the silicon oxide film as the interface layer. That is, preferably, the silicon oxide film remains in the nMIS formation region 1A as the interface layer between the Hf and Ln containing insulating film 5a and the semiconductor substrate 1 (p-type well 3). Further, the silicon oxide film remains in the pMIS formation region 1B as the interface layer between the Hf-containing insulating film 5 and the semiconductor substrate 1 (n-type well 4). Thus, a good device which suppresses degradation of driving force and reliability can be produced.

Figure 10:
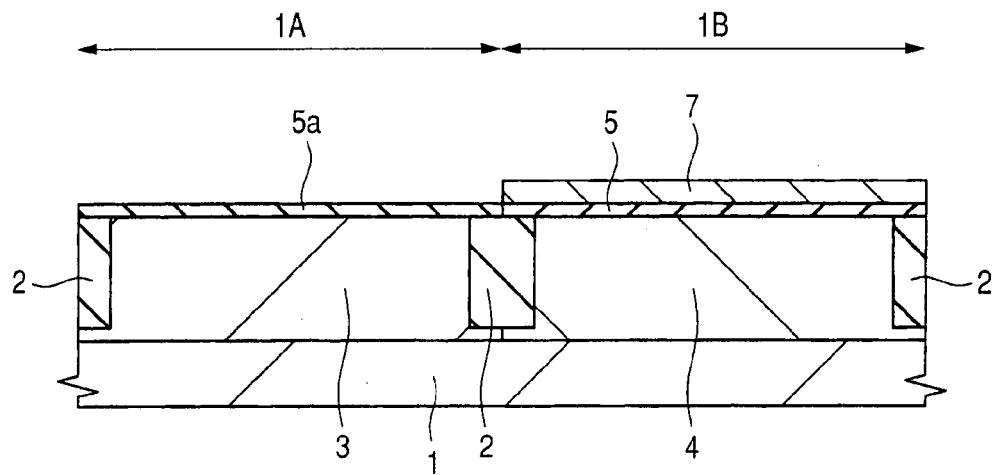
FIG. 10 is a cross-sectional view of a main part of the semiconductor device in a manufacturing step following the step shown in FIG. 9.

Then, as shown in FIG. 10, a part of the threshold adjustment film 8 (unreacted part of the threshold adjustment film 8) not reacted in the heat treatment at step S10 is removed by wet etching (in step S11 shown in FIG. 1).

An etching solution used in the wet etching process of the threshold adjustment film 8 in step S11 does not contain any one of the APM solution and the hydrofluoric acid. Specifically, the wet etching process of the threshold adjustment film 8 in step S11 can use diluted hydrochloric acid (diluted HCl) as an etching solution. In the wet etching process of the threshold adjustment film 8 in step S11, in the pMIS formation region 1B, the threshold adjustment film 8 is removed to expose the metal nitride film 7, while in the nMIS formation region 1A, a part of the threshold adjustment film 8 unreacted with the Hf-containing insulating film 5 in the heat treatment at step S10 is removed to expose the Hf and Ln containing insulating film 5a. In the heat treatment at step S10, the threshold adjustment film 8 of the nMIS formation region 1A often reacts with the Hf-containing insulating film 5 by the entire thickness of the film 8 depending on the thickness of the threshold adjustment film 8 formed. In this case, after the wet etching process of the threshold adjustment film 8 in step S11, in the pMIS formation region 1B, the metal nitride film 7 is exposed, while in the nMIS formation region 1A, the Hf and Ln insulating film 5a is exposed.

In the wet etching process of the threshold adjustment film 8 at step S11, the Hf and Ln containing insulating film 5a is exposed in the nMIS formation region 1A. Like the Hf-containing insulating film 5, the Hf and Ln containing insulating film 5a also has low resistance to the APM solution and hydrofluoric acid, and thus can be damaged by exposure to the APM solution or hydrofluoric acid. In this embodiment, neither the APM solution nor the hydrofluoric acid is used as the etching solution (more specifically, diluted hydrochloric acid is used as the etching solution) in the wet etching process of the threshold adjustment film 8 at step S11. Thus, the etching damage to the Hf and Ln containing insulating film 5a of the nMIS formation region 1A can be suppressed or prevented.

Figure 11:
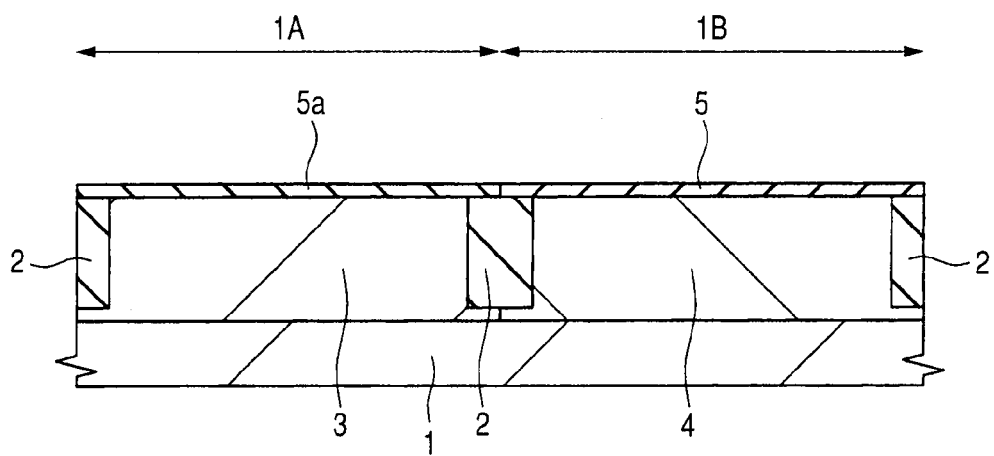
FIG. 11 is a cross-sectional view of a main part of the semiconductor device in a manufacturing step following the step shown in FIG. 10.

Then, as shown in FIG. 11, the metal nitride film 7 is removed by wet etching (in step S12 shown in FIG. 1). In the wet etching process at step S12, the metal nitride film 7 formed in the pMIS formation region 1B is removed, so that the Hf-containing insulating film 5 in the pMIS formation region 1B is exposed.

The wet etching process of the metal nitride film 7 is performed in step S12 with the Hf and Ln containing insulating film 5a in the nMIS formation region 1A exposed, but does not employ any one of the APM solution and hydrofluoric acid as an etching solution. Specifically, the etching solution used in the wet etching process of the metal nitride film 7 in step S12 contains hydrogen peroxide ($H_2O_2$), but does not include any one of ammonia ($NH_3$) and hydrofluoric acid. Thus, the etching damage to the Hf and Ln containing insulating film 5a in the nMIS formation region 1A and the Hf containing insulating film 5 in the pMIS formation region 1B can be suppressed or prevented. After the wet etching process of the metal nitride film 7 in step S12, both of the Hf and Ln containing insulating film 5a in the nMIS formation region 1A and the Hf-containing insulating film 5 in the pMIS formation region 1B are exposed.

Figure 12:
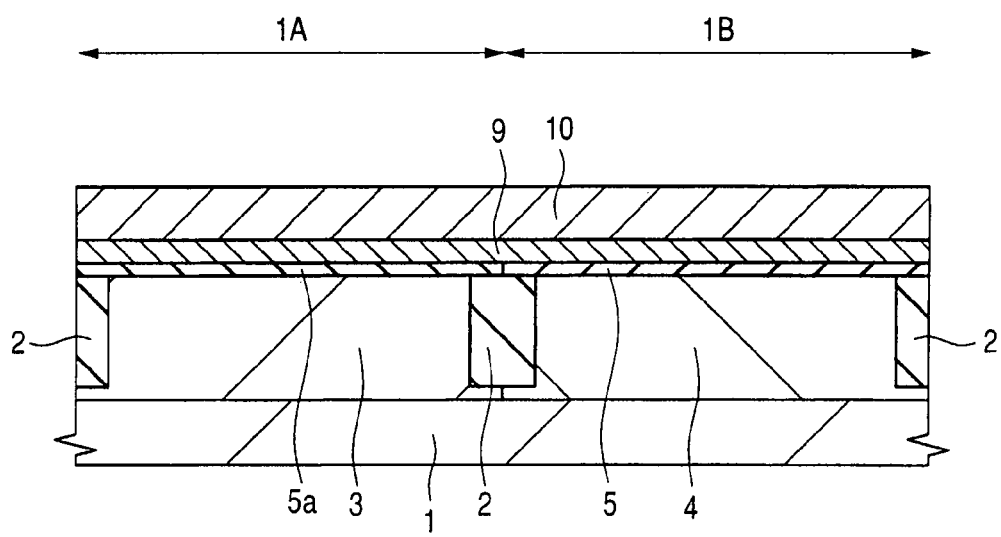
FIG. 12 is a cross-sectional view of a main part of the semiconductor device in a manufacturing step following the step shown in FIG. 11.

Then, as shown in FIG. 12, a metal film (metal layer) 9 for a metal gate (metal gate electrode) is formed over the main surface of the semiconductor substrate 1 (in step S13 shown in FIG. 1). In step S13, in the nMIS formation region 1A, the metal film 9 is formed on the Hf and Ln containing insulating film 5a, and in the pMIS formation region 1B, the metal film 9 is formed on the Hf-containing insulating film 5. The metal film 9 is preferably a titanium nitride (TiN) film, a tantalum nitride (TaN) film, or a tantalum carbide (TaC) film, and more preferably, a titanium nitride (TiN) film. The metal film 9 can be formed, for example, by sputtering or the like. The thickness of the metal film 9 can be, for example, about 10 to 20 nm.

The term "metal film (metal layer)" as used in the present application means a conductive film (conductive layer) having metallic conductivity, and contains not only a single metal film or an alloy film, but also a metal compound film having metallic conductivity (a metal nitride film, a metal carbide film, or the like). Thus, the metal film 9 is a conductive film having metallic conductivity, and preferably a titanium nitride (TiN) film, a tantalum nitride (TaN) film, or a tantalum carbide (TaC) film as mentioned above.

Then, a silicon film 10 is formed over the main surface of the semiconductor substrate 1, that is, on the metal film 9 (in step S14 shown in FIG. 1). The silicon film 10 can be a polycrystalline silicon film or an amorphous silicon film. Even when the silicon film 10 is an amorphous silicon film upon deposition, the heat treatment (for example, activation annealing of impurities introduced for source/drain) after the deposition converts the amorphous film into a polycrystalline silicon film. The thickness of the silicon film 10 can be, for example, about 100 nm.

The thickness of the metal film 9 formed in step S13 is increased, so that the formation process of the silicon film 10 in step S14 can be omitted (that is, gate electrodes GE1 and GE2 can be formed of the metal film 9 without the silicon film 10). In step S14, the silicon film 10 is more preferably formed on the metal film 9 (that is, the gate electrodes GE1 and GE2 are formed of a stacked film comprised of the metal film 9 and the silicon film 10 thereon). The reason for formation of the stacked film is as follows. The excessive thickness of the metal film 9 can pose problems of easy peeling of the metal film 9, or of damage to the substrate due to over-etching in patterning the metal film 9. However, since the gate electrode is formed out of the stacked film comprised of the metal film 9 and the silicon film 10, the thickness of the metal film 9 can be thinned, as compared to the case of forming a gate electrode out of only the metal film 9, which can improve the above problems. In forming the silicon film 10 on the metal film 9, conventional processing methods or processes for polysilicon gate electrodes (gate electrodes comprised of polysilicon) can be employed. This embodiment is superior in microfabrication processability, manufacturing cost, and yield.

Figure 13:
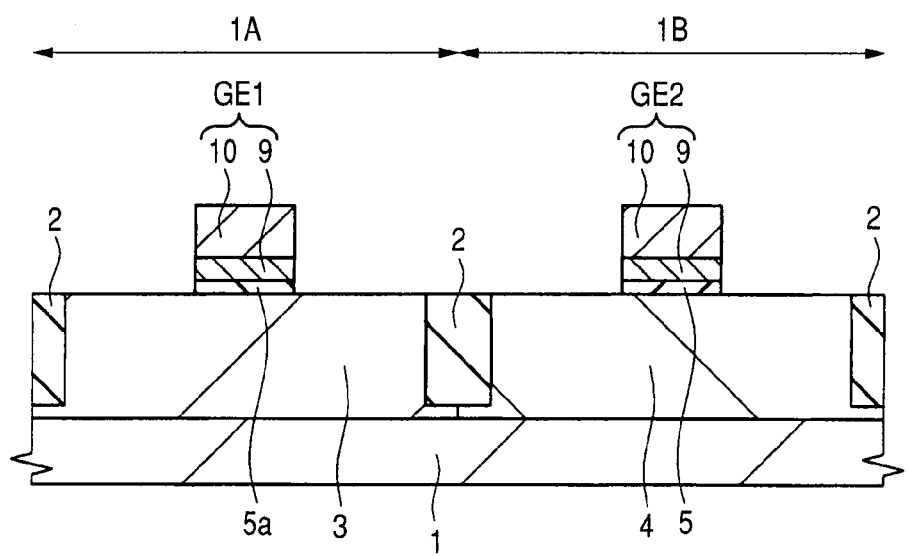
FIG. 13 is a cross-sectional view of a main part of the semiconductor device in a manufacturing step following the step shown in FIG. 12.

Then, as shown in FIG. 13, the stacked film of the silicon film 10 and the metal film 9 is patterned using photolithography and dry etching to form gate electrodes GE1 and GE2 comprised of the metal film 9 and the silicon film 10 on the metal film 9 (in step S15 shown in FIG. 1).

The gate electrode GE1 is formed on the Hf and Ln containing insulating film 5a in the nMIS formation region 1A, and the gate electrode GE2 is formed on the Hf-containing insulating film 5 in the pMIS formation region 1B. That is, the gate electrode GE1 comprised of the metal film 9 and the silicon film 10 on the metal film 9 is formed over the surface of the p-type well 3 in the nMIS formation region 1A via the Hf and Ln containing insulating film 5a as the gate insulating film. The gate electrode GE2 comprised of the metal film 9 and the silicon film 10 on the metal film 9 is formed over the surface of the n-type well 4 in the pMIS formation region 1B via the Hf-containing insulating film 5 as the gate insulating film. Each of the Hf-containing insulating film 5 and the Hf and Ln containing insulating film 5a has a dielectric constant higher than that of silicon oxide.

When patterning the silicon film 10 and the metal film 9 in step S15, a part of the Hf and Ln containing insulating film 5a positioned under the gate electrode GE1 and a part of the Hf-containing insulating film 5 positioned under the gate electrode GE2 remain without being removed. On the other hand, the other part of the Hf and Ln containing insulating film 5a not covered with the gate electrode GE1 and the other part of the Hf-containing insulating film 5 not covered with the gate electrode GE2 are removed by etching in patterning the silicon film 10 and the metal film 9 in step S15, and the following etching.

Figure 14:
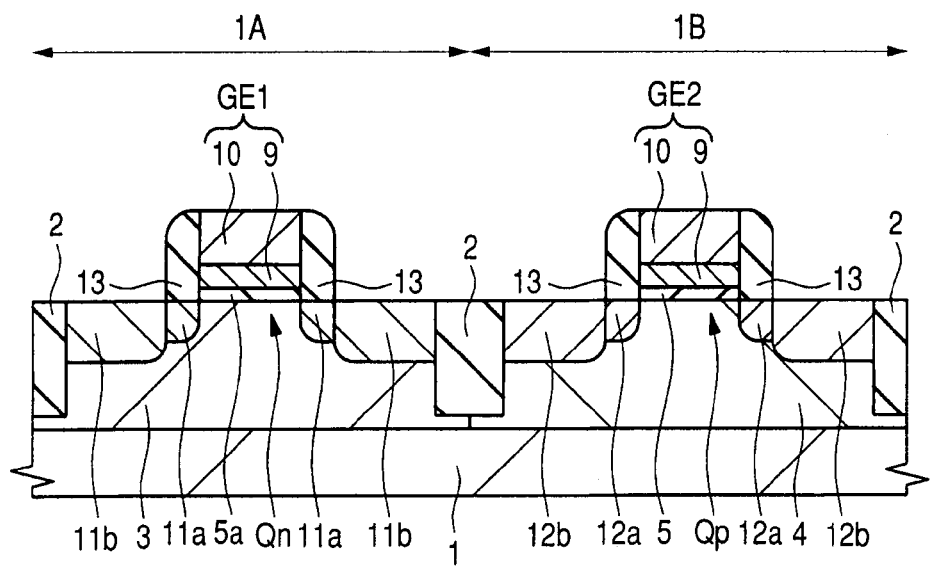
FIG. 14 is a cross-sectional view of a main part of the semiconductor device in a manufacturing step following the step shown in FIG. 13.

Then, as shown in FIG. 14, n-type impurities, such as phosphate (P) or arsenic (As), are ion-implanted into regions on both sides of the gate electrode GE1 of the p-type well 3 in the nMIS formation region 1A thereby to form n⁻-type semiconductor regions (extension region, or LDD (lightly doped drain) region) 11a. In the ion implantation for formation of the n⁻-type semiconductor regions 11a, the pMIS formation region 1B is covered with a photoresist film (not shown) as an ion implantation blocking mask, and ion implantation is carried out into the semiconductor substrate 1 (p-type well 3) in the nMIS formation region 1A using the gate electrode GE1 as a mask. Further, p-type impurities, such as boron (B), are ion-implanted into regions on both sides of the gate electrode GE2 of the n-type well 4 in the pMIS formation region 1B thereby to form p⁻-type semiconductor regions (extension region, or LDD (lightly doped drain) region) 12a. In the ion implantation for formation of the p⁻-type semiconductor regions 12a, the nMIS formation region 1A is covered with another photoresist film (not shown) as an ion implantation blocking mask, and ion implantation is carried out into the semiconductor substrate 1 (n-type well 4) in the pMIS formation region 1B using the gate electrode GE2 as a mask. The n$^-$-type semiconductor regions 11a may be formed in advance. Alternatively, the p$^-$-type semiconductor regions 12a may be formed in advance.

Then, sidewalls (sidewall spacer, sidewall insulating film) 13 made of an insulator are formed on the side walls of the gate electrodes GE1 and GE2. For example, a silicon oxide film and a silicon nitride film are formed over the semiconductor substrate 1 from the bottom in that order so as to cover the gate electrodes GE1 and GE2. A stacked film comprised of the silicon oxide film and the silicon nitride film is subjected to anisotropic etching (etched back), which can form the sidewalls 13 comprised of the silicon oxide film and the silicon nitride film which remain on the side walls of the gate electrodes GE1 and GE2. For simplification of the accompanying drawings, FIG. 14 shows the silicon oxide film and the silicon nitride film integrated together to form the sidewalls 13.

Then, n-type impurities, such as phosphorus (P) or arsenic (As), are ion-implanted into regions of the p-type well 3 on both sides of the gate electrode GE1 and sidewalls 13 in the nMIS formation region 1A thereby to form n$^+$-type semiconductor regions 11b (source, and drain). The n$^+$-type semiconductor region 11b has a higher impurity concentration and a deeper junction depth than those of the n$^-$-type semiconductor region 11a. In the ion implantation for formation of the n$^+$-type semiconductor regions 11b, the pMIS formation region 1B is covered with a photoresist film (not shown) as an ion implantation blocking mask, and ion implantation is carried out into the semiconductor substrate 1 (p-type well 3) in the nMIS formation region 1A using the gate electrode GE1 and the sidewalls 13 on its side wall as a mask. Thus, the n$^-$-type semiconductor region 11a is formed to match the gate electrode GE1, while the n$^+$-type semiconductor region 11b is formed to match the sidewall 13. Then, p-type impurities, such as boron (B), are ion-implanted into regions of the n-type well 4 on both sides of the gate electrode GE2 and the sidewall 13 in the pMIS formation region 1B thereby to form p$^+$-type semiconductor regions 12b (source, and drain). The p$^+$-type semiconductor region 12b has a higher impurity concentration and a deeper junction depth than those of the p$^-$-type semiconductor region 12a. In the ion implantation for formation of the p$^+$-type semiconductor region 12b, the nMIS formation region 1A is covered with another photoresist film (not shown) as the ion implantation blocking mask, and ion implantation is carried out into the semiconductor substrate 1 (n-type well 4) in the pMIS formation region 1B using the gate electrode GE2 and the sidewalls 13 on its side walls as a mask. Thus, the p$^-$-type semiconductor region 12a is formed to match the gate electrode GE2, while the p$^+$-type semiconductor region 12b is formed to match the sidewall 13. The n$^+$-type semiconductor regions 11b may be formed in advance. Alternatively, the p$^+$-type semiconductor regions 12b may be formed in advance.

N-type impurities are introduced into the silicon film 10 included in the gate electrode GE1 in the nMIS formation region 1A in the ion implantation process for formation of the n$^-$-type semiconductor region 11a, or in the ion implantation process for formation of the n$^+$-type semiconductor region 11b to convert the silicon film 10 into an n-type silicon film. P-type impurities are introduced into the silicon film 10 included in the gate electrode GE2 in the pMIS formation region 1B in the ion implantation process for formation of the p$^-$-type semiconductor region 12a, or in the ion implantation process for formation of the p$^+$-type semiconductor region 12b to convert the silicon film 10 into a p-type silicon film.

After the ion implantation, the anneal process (activation annealing, or heat treatment) is performed for activating the impurities introduced. Thus, the impurities introduced into the n$^-$-type semiconductor region 11a, p$^-$-type semiconductor region 12a, n$^+$-type semiconductor region 11b, and p$^+$-type semiconductor region 12b can be activated.

In this way, the structure as shown in FIG. 14 is provided with an n-channel MISFET (metal insulator semiconductor field effect transistor) Qn formed in the nMIS formation region 1A as a field-effect transistor, and with a p-channel MISFET Qp formed in the pMIS formation region 1B as another field-effect transistor.

The gate electrode GE1 serves as a gate electrode for the n-channel MISFET Qn. The Hf and Ln containing insulating film 5a under the gate electrode GE1 serves as the gate insulating film for the n-channel MISFET Qn. The n-type semiconductor region (impurity diffusion layer) serving as the source or drain of the n-channel MISFET Qn is formed of the n$^+$-type semiconductor region 11b and the n$^-$-type semiconductor region 11a. The gate electrode GE2 serves as the gate electrode for the p-channel MISFET Qp. The Hf containing insulating film 5 under the gate electrode GE2 serves as the gate insulating film for the p-channel MISFET Qp. The p-type semiconductor region (impurity diffusion layer) serving as the source or drain of the p-channel MISFET Qp is formed of the p$^+$-type semiconductor region 12b and the p$^-$-type semiconductor region 12a. The source and drain regions of the n-channel MISFET Qn and the p-channel MISFET Qp each have a LDD structure. The n$^+$-type semiconductor region 11b can be regarded as a semiconductor region for the source or drain of the n-channel MISFET Qn, and the p$^+$-type semiconductor region 12b can be regarded as a semiconductor region for the source or drain of the p-channel MISFET Qp.

The Hf and Ln containing insulating film 5a serving as the gate insulating film for the n-channel MISFET Qn has a rare-earth element Ln content higher than that of the Hf-containing insulating film 5 serving as the gate insulating film for the p-channel MISFET Qp. This is because in the heat treatment at step S10, the rare-earth element Ln is introduced into the Hf-containing insulating film 5 (which is to be converted into the Hf and Ln containing insulating film 5a) in the nMIS formation region 1A, but not introduced into the Hf-containing insulating film 5 in the pMIS formation region 1B. Thus, the rare-earth element Ln content in the Hf and Ln containing insulating film 5a (that is, the gate insulating film of the n-channel MISFET Qn) in the nMIS formation region 1A is higher than the rare-element Ln content in the Hf-containing insulating film 5 (that is, the gate insulating film of the p-channel MISFET Qp) in the pMIS formation region 1B. In depositing the Hf-containing insulating film 5 at step S4, the Hf-containing insulating film 5 is preferably controlled not to contain rare-earth elements. Thus, the Hf-containing insulating film 5 serving as the gate insulating film of the p-channel MISFET Qp can be in the state without containing the rare-earth element.

Figure 15:
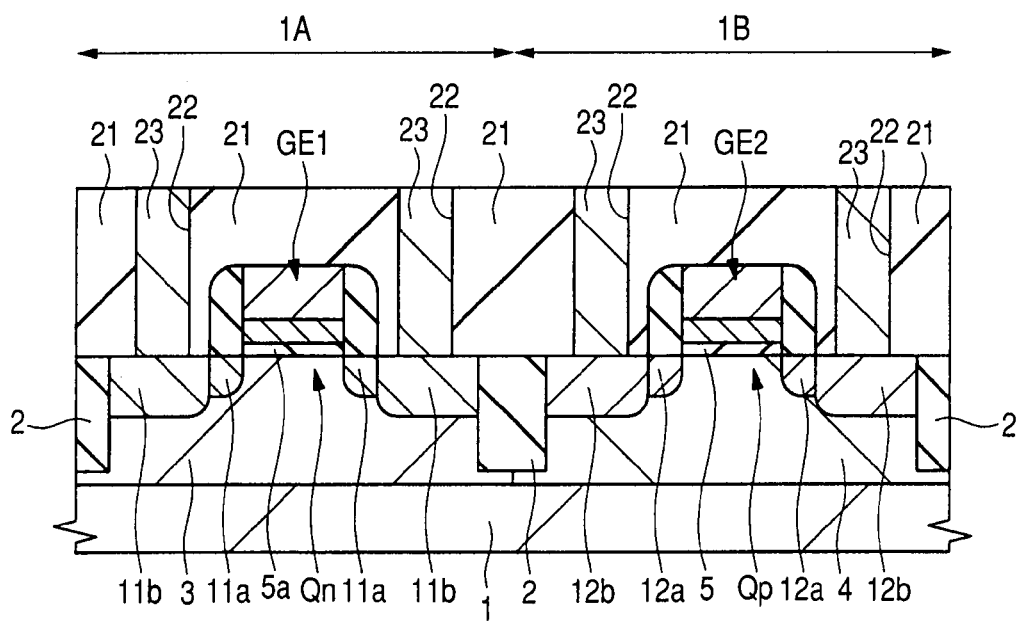
FIG. 15 is a cross-sectional view of a main part of the semiconductor device in a manufacturing step following the step shown in FIG. 14.

Then, as shown in FIG. 15, an insulating film (interlayer insulating film) 21 is formed over the main surface of the semiconductor substrate 1 so as to cover the gate electrodes GE1 and GE2. The insulating film 21 is, for example, a single film made of a silicon oxide film, or a stacked film comprised of a thin silicon nitride film and a thick silicon oxide film thereon. After forming the insulating film 21, the surface of the insulating film 21 is planarized using, for example, a chemical mechanical polishing (CMP) method.

Then, the insulating film 21 is dry-etched using a photoresist pattern (not shown) formed on the insulating film 21 as an etching mask thereby to form contact holes (through holes, or holes) 22 in the insulating film 21. The contact holes 22 are formed above the $n^+$-type semiconductor region 11b, the $p^+$-type semiconductor region 12b, and the gate electrodes GE1 and GE2.

Then, conductive plugs (conductors for connection) 23 comprised of tungsten (W) or the like are formed in the contact holes 22. In order to form the plugs 23, a barrier conductive film (for example, a titanium film, a titanium nitride film, or a stacked film thereof) is formed on the insulating film 21 including the insides (bottoms and side walls) of the contact holes 22. Then, a main conductive film comprised of a tungsten film or the like is formed over the barrier conductive film so as to fill the contact holes 22 therewith. The unnecessary parts of the main conductive film and the barrier conductive film over the insulating film 21 can be removed by the CMP method, the etch back method, or the like thereby to form the plugs 23. For simplification of the accompanying drawings, FIG. 15 shows the barrier conductive film and the main conductive film (tungsten film) included in the plugs 23 and integrated together.

Figure 16:
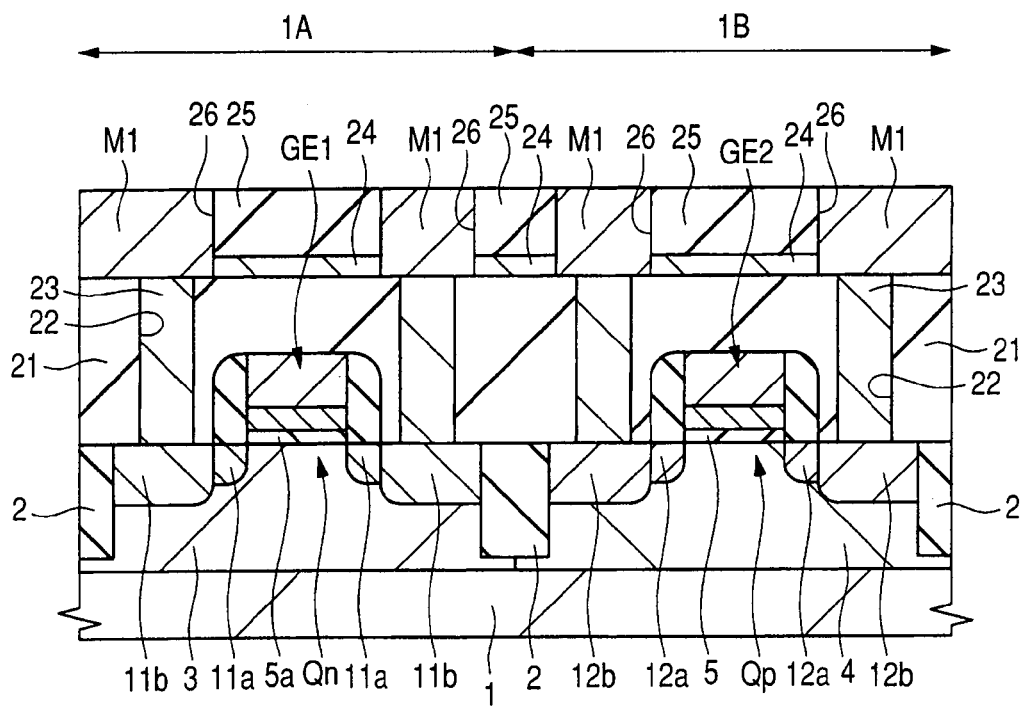
FIG. 16 is a cross-sectional view of a main part of the semiconductor device in a manufacturing step following the step shown in FIG. 15.

Then, as shown in FIG. 16, a stopper insulating film (insulating film for an etching stopper) 24 and an insulating film (interlayer insulating film) 25 for formation of wiring are formed in that order on the insulating film 21 with the plugs 23 embedded therein. The stopper insulating film 24 is a film serving as an etching stopper in processing slots in the insulating film 25. The stopper insulating film 24 is made of material having etching selectivity to the insulating film 25. For example, the stopper insulating film 24 can be a silicon nitride film, and an insulating film 25 can be a silicon oxide film.

Then, a first layer wiring is formed by a single damascene method. First, wiring slots 26 are formed in predetermined areas of the insulating film 25 and the stopper insulating film 24 by dry etching using a resist pattern (not shown) as a mask. Then, a barrier conductive film (for example, a titanium nitride film, a tantalum film, or a tantalum nitride film, or the like) is formed over the main surface of the semiconductor substrate 1 (that is, on the insulating film 25 including the bottom and side walls of the wiring slot 26). Subsequently, a copper seed layer is formed over the barrier conductive film by the CVD or sputtering method. Further, a copper plating film is formed over the seed layer by electrolytic plating. The copper plating film fills the inside of the wiring slots 26. Then, the copper plating film, the seed layer, and the barrier metal film positioned in an area other than the wiring slots 26 are removed by the CMP method, so that the first layer wiring M1 including copper as a principal conductive material is formed. For simplification of the accompanying drawings, FIG. 16 shows the copper plating film, the seed layer, and the barrier conductive film which form the wiring M1 and which are integrated together.

The wiring M1 is electrically coupled to the $n^+$-type semiconductor region 11b and the $p^+$-type semiconductor region 12b for the source or drain of the n-channel MISFET Qn and p-channel MISFET Qp via the plugs 23. Thereafter, the second or later wirings are formed by the dual damascene method or the like. The illustration and description thereof will be omitted below. The wiring M1 is not limited to the damascene wiring, and can also be formed by patterning the conductive film for wiring. The wiring M1 can be, for example, a tungsten wiring, or an aluminum wiring.

Now, the features of this embodiment will be described below in more detail.

In this embodiment, the gate electrodes GE1 and GE2 of the n-channel MISFET Qn and the p-channel MISFET Qp each have the metal film 9 positioned on the gate insulating film (which is the Hf and Ln containing insulating film 5a and the Hf-containing insulating film 5), and are the so-called metal gate electrode. Thus, the depletion of the gate electrode is suppressed, which can eliminate the parasitic capacity, and can reduce the size of the MISFET element (which can make the gate insulating film thinner).

In this embodiment, the Hf and Ln containing insulating film 5a having a dielectric constant higher than that of a silicon oxide is used as a gate insulating film for the n-channel MISFET Qn, and the Hf-containing insulating film 5 having a dielectric constant higher than that of the silicon oxide is used as a gate insulating film for the p-channel MISFET Qp. That is, the material films having a dielectric constant higher than that of a silicon oxide, that is, the so-called High-k films (high-dielectric-constant films), namely, the Hf and Ln containing insulating film 5a and the Hf-containing insulating film 5 are used as the gate insulating films for the n-channel MISFET Qn and the p-channel MISFET Qp. The Hf and Ln containing insulating film 5a and the Hf-containing insulating film 5 can have the physical thicknesses thereof increased as compared to the case of using a silicon oxide film in the gate insulating films of the n-channel MISFET Qn and p-channel MISFET Qp, which can reduce leak current.

In this embodiment, the Hf-containing insulating film 5 is used for the gate insulating film of the p-channel MISFET Qp, and the Hf and Ln containing insulating film 5a is used instead of the Hf-containing insulating film 5 for the gate insulating film of the n-channel MISFET Qn. Accordingly, the absolute value of a threshold (threshold voltage) of the n-channel MISFET Qn can be decreased. That is, the threshold of the n-channel MISFET Qn can be lowered.

For example, when the titanium nitride is used for the metal gate electrode, and the Hf-based gate insulating film (a high-dielectric-constant film containing Hf) is used as the gate insulating film, the metal gate electrode has an original work function of about 4.7 to 4.8 eV. Further, by introducing a rare-earth element, especially lanthanum (La), into the Hf-based gate insulating film, a work function of the metal gate electrode comprised of titanium nitride can be controlled to about 4.1 to 4.6 eV. When in the n-channel MISFET the work function of the gate electrode is brought close to the conduction band of silicon (to about 4.05 eV), the threshold voltage of the n-channel MISFET can be reduced. Thus, in this embodiment, the Hf and Ln containing insulating film 5a is used as the gate insulating film of the n-channel MISFET Qn. This embodiment can decrease and bring the effective work function of the metal film 9 closer to the conduction band of silicon, as compared to the case of using the Hf-containing insulating film 5 as the gate insulating film of an n-channel MISFET Qn unlike this embodiment. Therefore, this embodiment can lower the threshold of the n-channel MISFET Qn.

For example, the Hf and Ln containing insulating film 5a is used as the gate insulating film of the n-channel MISFET Qn in this embodiment. This embodiment can lower the absolute value of the threshold (threshold voltage) of the n-channel MISFET Qn by about 0.1 to 0.6 V, as compared to the case of using the same Hf-containing insulating film 5 as the gate insulting film of the p-channel MISFET Qp in the gate insulating film of the n-channel MISFET Qn unlike this embodiment.

In order to obtain such an effect of reducing the threshold of the n-channel MISFET Qn, the threshold adjustment film 8 contains a rare-earth element, and is preferably, a rare-earth oxide film, and more preferably, a lanthanum oxide film. Since the Hf and Ln containing insulating film 5a contains the rare-earth element (Ln), especially preferably, lanthanum (La), the threshold of the n-channel MISFET Qn can surely be decreased effectively.

The degree of reduction in threshold of the n-channel MISFET Qn by introducing the rare-earth element (specifically, lanthanum) into the Hf and Ln containing insulating film 5a can be controlled by the thickness of the threshold adjustment film 8 formed in the above step S9, the temperature of heat treatment in the above step S10, and the like. The more the rare-earth element (especially, lanthanum) content in the Hf and Ln containing insulating film 5a, the lower the threshold of the n-channel MISFET Qn can be. By increasing the thickness of the threshold adjustment film 8 formed in step S9 or the temperature of heat treatment in step S10, the rare-earth element (especially, lanthanum) content in the Hf and Ln containing insulating film 5a can be increased to further decrease the threshold of the n-channel MISFET Qn. Thus, the thickness of the threshold adjustment film 8 formed in step S9 and/or the temperature of heat treatment in step S10 can be set according to a desired threshold of the n-channel MISFET Qn.

In this embodiment, the gate electrodes GE1 and GE2 of the n-channel MISFET Qn and p-channel MISFET Qp are formed by patterning a common conductive film (a stacked film of the metal film 9 and the silicon film 10 on the metal film 9). Accordingly, this embodiment can simplify the manufacturing process of the semiconductor device, and also can achieve the improvement of throughput of the semiconductor device, the reduction in manufacturing cost of the semiconductor device, and the improvement of the manufacturing yield of the semiconductor device.

This embodiment has one of the main features that the metal nitride film 7 is formed. This will be described by comparing manufacturing steps of this embodiment shown in FIGS. 1 to 16 with manufacturing steps of a comparative example shown in FIGS. 17 to 21.

FIGS. 17 to 21 are cross-sectional views of main parts of a semiconductor device of a comparative example during respective manufacturing steps. The manufacturing process of the comparative example shown in FIGS. 17 to 21 corresponds to the case where such a film as the metal nitride film 7 is not formed unlike this embodiment. In the following, the manufacturing process of the comparative example shown in FIGS. 17 to 21 will be described below.

Figure 17:
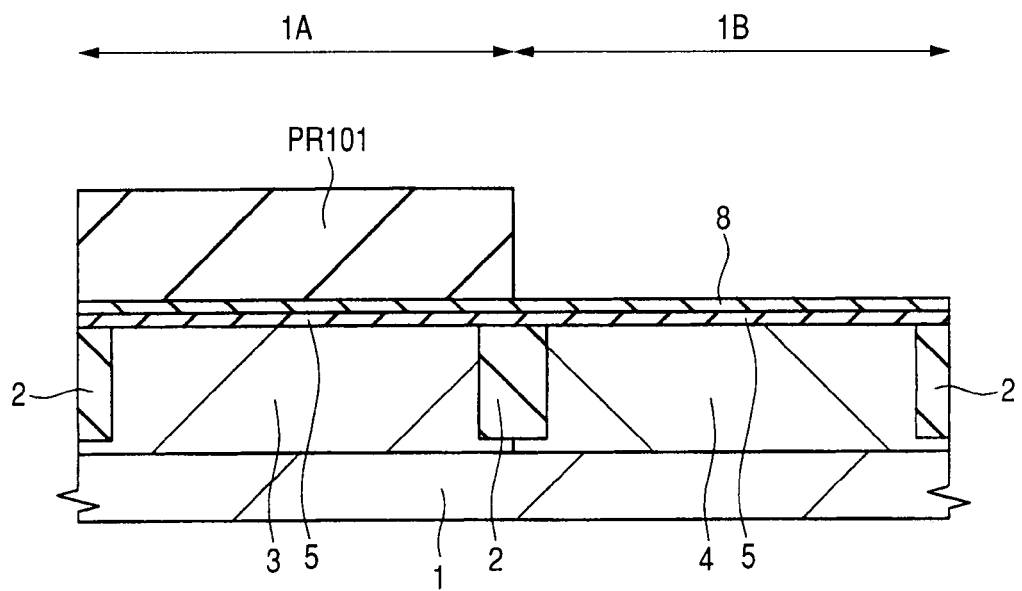
FIG. 17 is a cross-sectional view of a main part of a semiconductor device in a manufacturing step in a comparative example.

In the manufacturing process of the comparative example, the same steps as steps S1 to S4 of this embodiment are performed to obtain the same structure as that shown in FIG. 3. Thereafter, without performing steps S5 to S8 of this embodiment (that is, without forming the metal nitride film 7 unlike this embodiment), the threshold adjustment film 8 is formed over the main surface of the semiconductor substrate 1, that is, on the Hf-containing insulating film 5 as shown in FIG. 17.

Then, a photoresist film is applied to the threshold adjustment film 8. The photoresist film is exposed to light and developed thereby to form a photoresist pattern PR101. The photoresist pattern PR101 is formed in the nMIS formation region 1A, but not formed in the pMIS formation region 1B. Thus, the threshold adjustment film 8 in the nMIS formation region 1A is covered with the photoresist pattern PR101, but the threshold adjustment film 8 in the pMIS formation region 1B is exposed without being covered with the photoresist pattern PR101.

Figure 18:
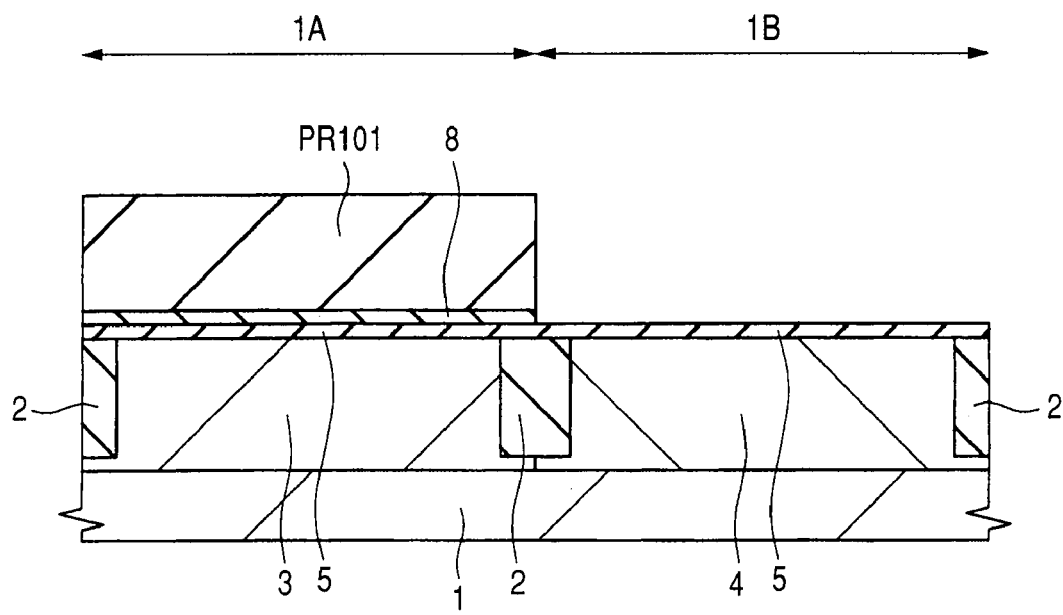
FIG. 18 is a cross-sectional view of a main part of the semiconductor device in a manufacturing step following the step shown in FIG. 17 in the comparative example.

Then, as shown in FIG. 18, the threshold adjustment film 8 is wet-etched using the photoresist pattern PR101 as an etching mask. In the wet etching process, the threshold adjustment film 8 positioned in the pMIS formation region 1B is removed by the etching, but the threshold adjustment film 8 in the nMIS formation region 1A is covered with the photoresist pattern PR101 and remains without being etched.

Figure 19:
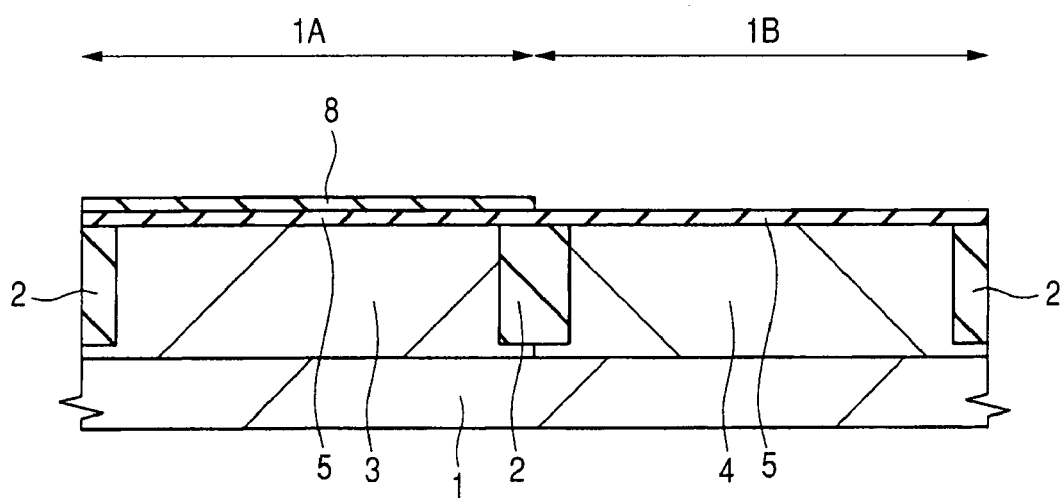
FIG. 19 is a cross-sectional view of a main part of the semiconductor device in a manufacturing step following the step shown in FIG. 18 in the comparative example.

Then, as shown in FIG. 19, the photoresist pattern PR101 is removed.

Figure 20:
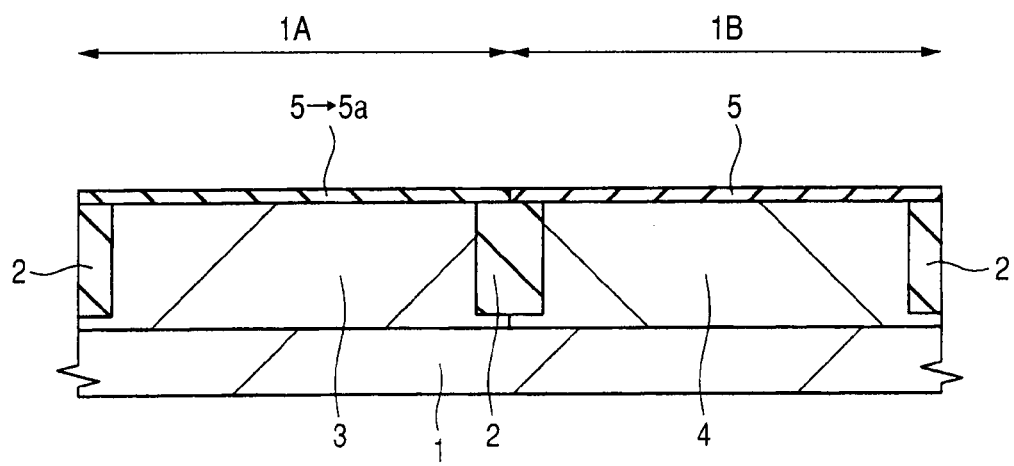
FIG. 20 is a cross-sectional view of a main part of the semiconductor device in a manufacturing step following the step shown in FIG. 19 in the comparative example.

Then, as shown in FIG. 20, heat treatment is applied to the semiconductor substrate 1, so that the threshold adjustment film 8 reacts with the Hf-containing insulating film 5 in the nMIS formation region 1A to form the Hf and Ln containing insulating film 5a. Since the threshold adjustment film 8 does not exist in the pMIS formation region 1B, the Hf and Ln containing insulating film 5a is not formed. Thereafter, a part of the threshold adjustment film 8 unreacted in the heat treatment can also be removed by wet etching.

Figure 21:
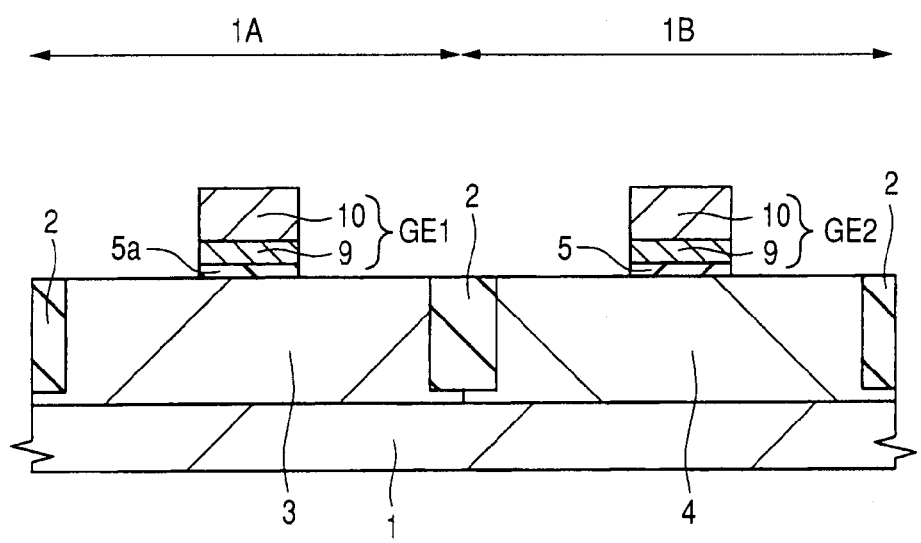
FIG. 21 is a cross-sectional view of a main part of the semiconductor device in a manufacturing step following the step shown in FIG. 20 in the comparative example.

Then, as shown in FIG. 21, the metal film 9 for a metal gate and the silicon film 10 are formed over the main surface of the semiconductor substrate 1 in that order. The stacked film of the silicon film 10 and the metal film 9 are patterned by use of the photolithography and dry etching techniques to form the gate electrodes GE1 and GE2. The following steps are the same as those shown in FIGS. 14 to 16 described above.

The inventors have found that the manufacturing process of the comparative example shown in FIG. 17 to 21 has the following problems.

That is, when some residues of the photoresist pattern PR101 leave on the threshold adjustment film 8 after removing the photoresist pattern PR101 at the step shown in FIG. 19, the residues adversely affect the characteristics and reliability of the MISFET to be formed later. For this reason, the photoresist pattern PR101 needs to be completely removed without any residues in removing the photoresist pattern PR101 at the step shown in FIG. 19. In order to do so, the photoresist pattern PR101 is required to be removed using the APM solution. The studies by the inventors, however, have shown that when the photoresist pattern PR101 is removed by the APM solution, the Hf-containing insulating film 5 exposed in the pMIS formation region 1B is exposed to the APM solution, and damaged due to weak resistance to the APM solution. The damage to the Hf-containing insulating film 5 in the pMIS formation region 1B by the APM solution adversely affects the characteristics and reliability of the p-channel MISFET formed.

In contrast, in this embodiment, the metal nitride film 7 is selectively formed on the Hf-containing insulating film 5 in the pMIS formation region 1B in steps S5 to S7. When the threshold adjustment film 8 formed in step S9 reacts with the Hf-containing insulating film 5 under the heat treatment in step S10, the metal nitride film 7 serves as a reaction barrier layer (reaction preventing mask).

Thus, in this embodiment, in step S8, an organic solvent or the like is used to remove the photoresist pattern PR1 without using the APM solution in step S8, which can suppress or prevent the damage to the Hf-containing insulating film 5 in the nMIS formation region 1A. Since the photoresist pattern PR1 is removed without using the APM solution in step S8, any residues of the photoresist pattern PR1 can remain on the metal nitride film 7. However, the residues are removed together with the metal nitride film 7 when wet-etching the metal nitride film 7 in step S12. Even when the residues of the photoresist pattern PR1 remain on the metal nitride film 7 after the removing process of the photoresist pattern PR1 in step S8 until the time of removing the metal nitride film 7 by wet etching in step S12, the residues does not affect the Hf-containing insulating film 5 in the heat treatment at step S10. This is because the nitride film 7 intervenes between the residues and the Hf-containing insulating film 5. Thus, even when the residues of the photoresist pattern PR1 remain on the metal nitride film 7 by removing the photoresist pattern PR1 in step S8 without using the APM solution, the residues can be prevented from adversely affecting the characteristics and reliability of the MISFET formed.

Further, the Hf-containing insulating film 5 and the Hf and Ln containing insulating film 5a are weak not only to the APM solution, but also to a hydrofluoric acid. In this embodiment, not only in the removing process of the photoresist pattern in step S8, but also in other steps, a wet process is not performed using one or both of the APM solution and the hydrofluoric acid while exposing the Hf-containing insulating film 5 and the Hf and Ln containing insulating film 5a. The Hf-containing insulating film 5 and the Hf and Ln containing insulating film 5a serve as the gate insulating film under the gate electrode GE1 and GE2 to be formed later. That is, until the metal film 9 is formed in step S13 after the wet etching of the metal nitride film 7 in step S7, the wet process is not performed using one or both of the APM solution and the hydrofluoric acid. Specifically, any one of the wet etching process of the metal nitride film 7 in step S7, the removing process of the photoresist pattern PR1 in step S8, the wet etching of the threshold adjustment film 8 in step S11, and the wet etching process of the metal nitride film 7 in step S12 is the wet process, but does not use both of the APM solution and the hydrofluoric acid (that is, the wet process is performed without using the APM solution and the hydrofluoric acid). Thus, the Hf-containing insulating film 5 and the Hf and Ln containing insulating film 5a can be suppressed or prevented from being damaged.

Unlike this embodiment, an insulating film (insulating film hard mask) is possibly used instead of the metal nitride film 7. In this case, the insulating film hard mask is very difficult to remove, while suppressing the damage to the Hf-based gate insulating film. This is based on the following reason. The use of hydrofluoric acid is required to remove the insulating film hard mask, but possibly etches the Hf-based gate insulating film in addition to the insulating film hard mask at the same time.

In contrast, this embodiment uses the metal nitride film 7 which is removable without using the APM solution or hydrofluoric acid. More specifically, this embodiment uses the metal nitride film 7 which is removable by a hydrogen peroxide ($H_2O_2$) based chemical having a small amount of etching (or a low etching speed) of the Hf-based gate insulating film. And, the metal nitride film 7 is wet-etched in steps S7 and S12 using the chemical containing hydrogen peroxide (hydrogen peroxide solution) without ammonia and hydrofluoric acid. Thus, the metal nitride film 7 can be removed, while suppressing the damage to the Hf-based gate insulating film (Hf-containing insulating film 5, or Hf and Ln containing insulating film 5a).

Unlike this embodiment, a manufacturing method can be proposed in which the removing step of the metal nitride film 7 in step S12 is omitted, and a metal gate electrode of a p-channel MISFET is formed of the metal nitride film 7 remaining in the pMIS formation region 1B. However, the superficial part of the metal nitride film 7 may be oxidized in forming the threshold adjustment film 8 in step S9 or in performing the heat treatment in step S10 in contact with the threshold adjustment film 8. Unlike this embodiment, when the removing step of the metal nitride film 7 in step S12 is omitted, and the metal nitride film 7 having a superficial part oxidized is used in the metal gate electrode, oxygen can be diffused from the superficial part of the oxidized metal nitride film 7 into the gate insulating film, or can be diffused into the entire metal gate. This leads to variations in characteristics of the MISFET, an increase in gate resistance, and the like.

In contrast, in this embodiment, the metal nitride film 7 remaining in the pMIS formation region 1B is removed in the wet etching process of the metal nitride film 7 in step S12, and then the metal film 9 for a metal gate electrode is formed in step S13. The metal film 9 is used for the metal gate electrodes of the n-channel MISFET Qn and the p-channel MISFET Qp. Thus, variations in characteristics of the n-channel MISFET Qn and the p-channel MISFET Qp can be prevented, and the increase in gate resistance can also be prevented.

The excessively thin metal nitride film 7 can cause the rare-earth element Ln of the threshold adjustment film 8 to pass through the metal nitride film 7 in the heat treatment at step S10. The excessively thick metal nitride film 7 causes the Hf and Ln containing insulating film 5a in the nMIS formation region 1A to be easily damaged when the metal nitride film 7 is removed by wet etching in step S12. From this viewpoint, the thickness of the metal nitride film 7 formed in step S5 is preferably 5 to 20 nm.

The metal nitride film 7 and the metal film 9 which are formed of the same material film are more preferable because these films have the following effects.

That is, in step S12, the metal nitride film 7 remaining in the pMIS formation region 1B is removed by wet etching. The wet etching is performed while exposing the Hf and Ln containing insulating film 5a in the nMIS formation region 1A. Excessive over-etching can damage the Hf and Ln containing insulating film 5a even without using the APM solution or hydrofluoric acid as the etching solution. In contrast, when the metal nitride film 7 and the metal film 9 are formed of the same material film, variations in characteristics of the p-channel MISFET Qp due to etching residues of the film 7 can be suppressed or prevented. This is because, even when any residue of etching of the metal nitride film 7 is generated in wet-etching the metal nitride film 7 in the pMIS formation region 1B in step S12, the etching residue is made of the same material as that of the metal film 9 formed in step S13. Thus, the amount of over etching in the removing step of the metal nitride film 7 at step S12 can be suppressed by forming the metal nitride film 7 and the metal film 9 out of the same material film, which can more accurately prevent the damage to the Hf and Ln containing insulating film 5a, and can further improve the characteristics and reliability of the semiconductor device. In the case of forming the metal nitride film 7 and the metal film 9 out of the same material film, both the metal nitride film 7 and the metal film 9 are preferably formed of titanium nitride (TiN) taking into consideration a work function of the metal film 9 and the function of the metal nitride film 7 as a reaction barrier layer.

Even when any etching residues of the metal nitride film 7 are generated in wet-etching the metal nitride film 7 in the pMIS formation region 1B in step S12, the superficial part of the oxidized metal nitride film 7 is removed, and a part of the lower layer part of the metal nitride film 7 (unoxidized part) remains as the etching residue. Thus, this embodiment does not have the problem which will occur when the wet etching process of the metal nitride film 7 in the above step S12 is omitted and the metal nitride film 7 is used in the metal gate electrode.

In this embodiment, the hard mask (or the metal nitride film 7) is used only once in the step of separately making the n-channel MISFET Qn and the p-channel MISFET Qp. Thus, this embodiment is appropriate for microfabrication.

Second Embodiment

Figure 22:
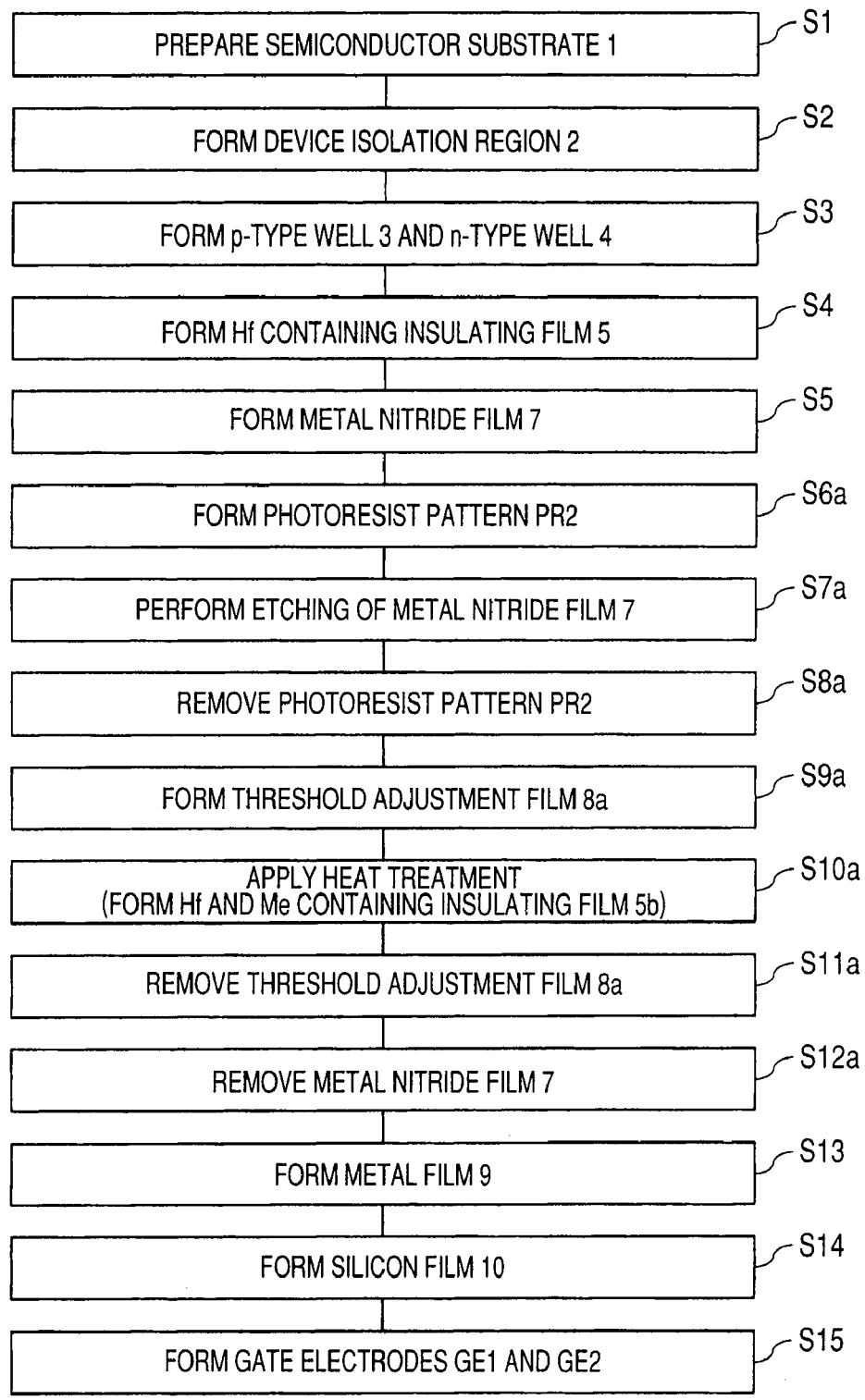
FIG. 22 is a manufacturing process flowchart showing parts of a manufacturing process of a semiconductor device according to another embodiment of the invention.

FIG. 22 is a manufacturing process flow chart showing parts of a manufacturing process of a semiconductor device according to a second embodiment of the invention, and corresponds to FIG. 1 of the first embodiment. FIGS. 23 to 30 are cross-sectional views of main parts of the semiconductor device during the respective manufacturing steps in the second embodiment.

The manufacturing process of this embodiment is the same as that of the first embodiment until the step of forming the metal nitride film 7 in step S5, and a description thereof will be omitted below. Steps following the formation of the metal nitride film 7 in step S5 will be described below.

Figure 23:
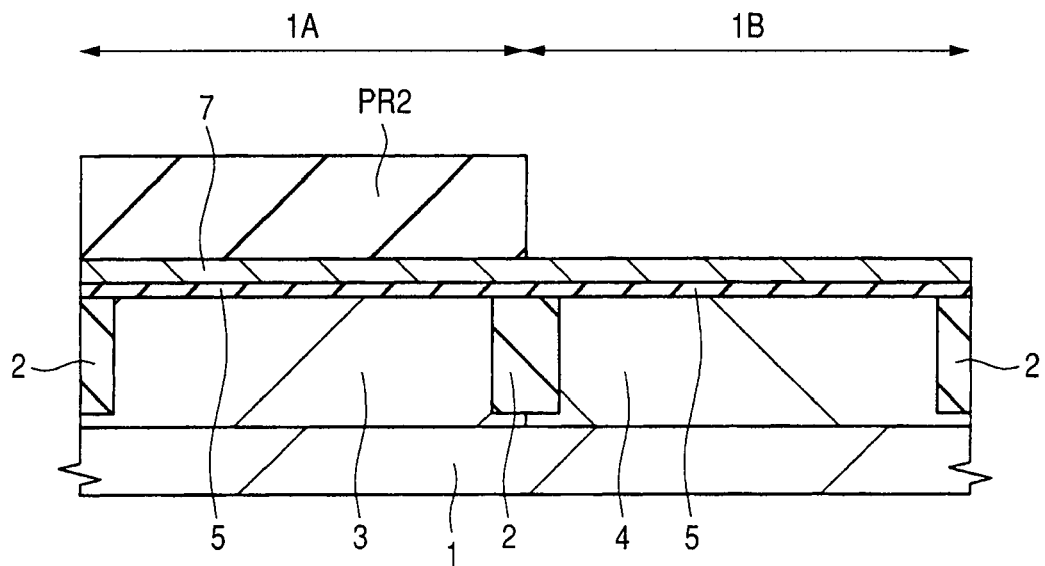
FIG. 23 is a cross-sectional view of a main part of the semiconductor device in a manufacturing step in another embodiment of the invention.

The same processes shown in steps S1 to S5 of the first embodiment are performed to obtain the structure shown in FIG. 4. Then, in this embodiment, as shown in FIG. 23, a photoresist film is applied over the main surface of the semiconductor substrate 1, that is, on the metal nitride film 7. The photoresist film is exposed to light and developed thereby to form a photoresist pattern (resist pattern) PR2 as a resist pattern (in step S6a shown in FIG. 22).

The photoresist pattern PR2 is formed on the metal nitride film 7 in the nMIS formation region 1A, but not formed in the pMIS formation region 1B. The metal nitride film 7 in the nMIS formation region 1A is covered with the photoresist pattern PR2, and the metal nitride film 7 in the pMIS formation region 1B is exposed without being covered with the photoresist pattern PR2.

Figure 24:
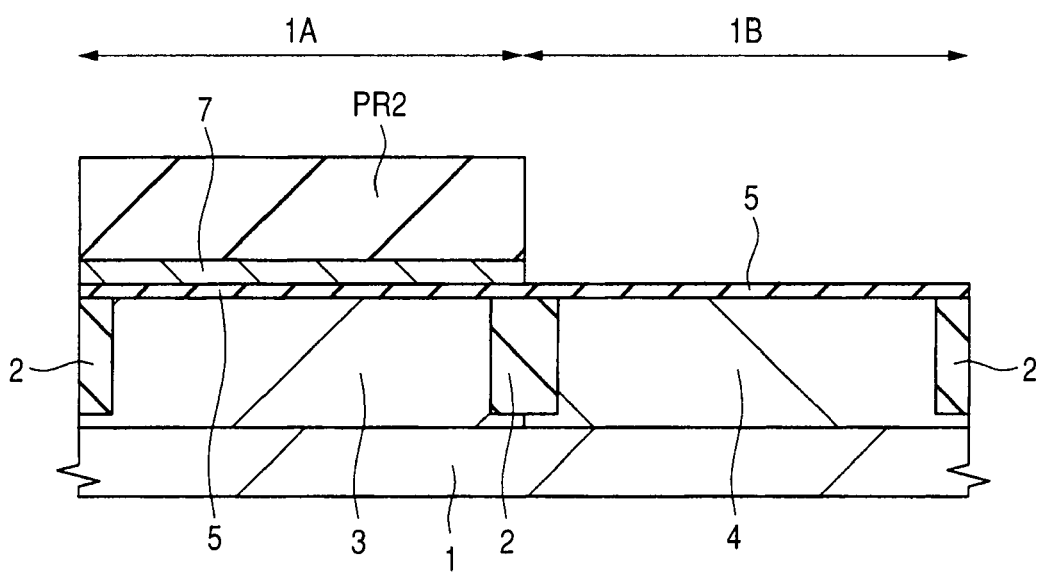
FIG. 24 is a cross-sectional view of a main part of the semiconductor device in a manufacturing step following the step shown in FIG. 23.

Then, the metal nitride film 7 is wet-etched using the photoresist pattern PR2 as an etching mask (in step S7a shown in FIG. 22). An etching solution used in the wet etching process of the metal nitride film 7 in step S7a is the same as that used in the wet etching process of the metal nitride film 7 in step S7 of the first embodiment. As shown in FIG. 24, in the wet etching process at step S7a, the metal nitride film 7 in the pMIS formation region 1B is etched and removed, while the metal nitride film 7 in the nMIS formation region 1A is covered with the photoresist pattern PR2, and remains without being etched. Thus, the Hf-containing insulating film 5 in the pMIS formation region 1B is exposed, while the Hf-containing insulating film 5 in the nMIS formation region 1A remains covered with the metal nitride film 7 (that is, without being exposed).

Figure 25:
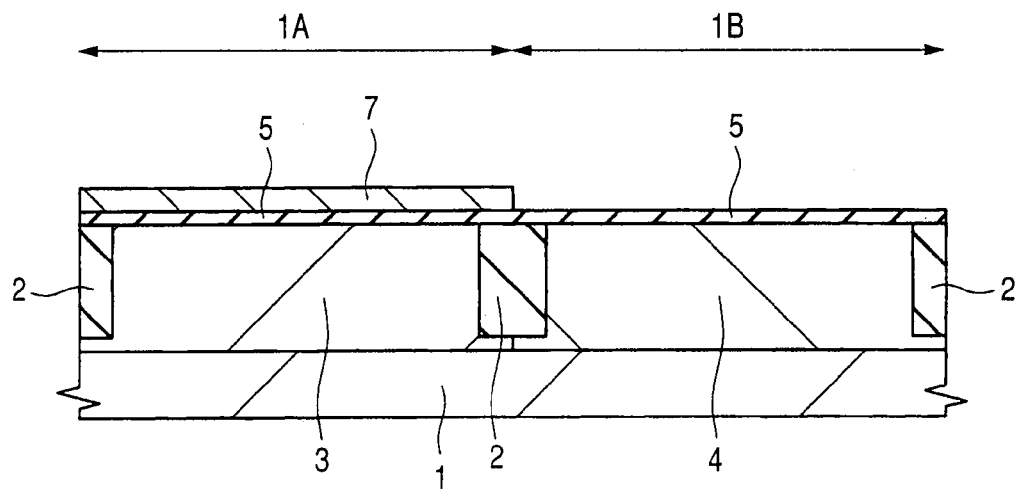
FIG. 25 is a cross-sectional view of a main part of the semiconductor device in a manufacturing step following the step shown in FIG. 24.

Then, as shown in FIG. 25, the photoresist pattern PR2 is removed (in step S8a shown in FIG. 22). The step of removing the photoresist pattern PR2 in step S8a is performed in the same way as the step of removing the photoresist pattern PR1 in step S8 of the first embodiment.

Figure 26:
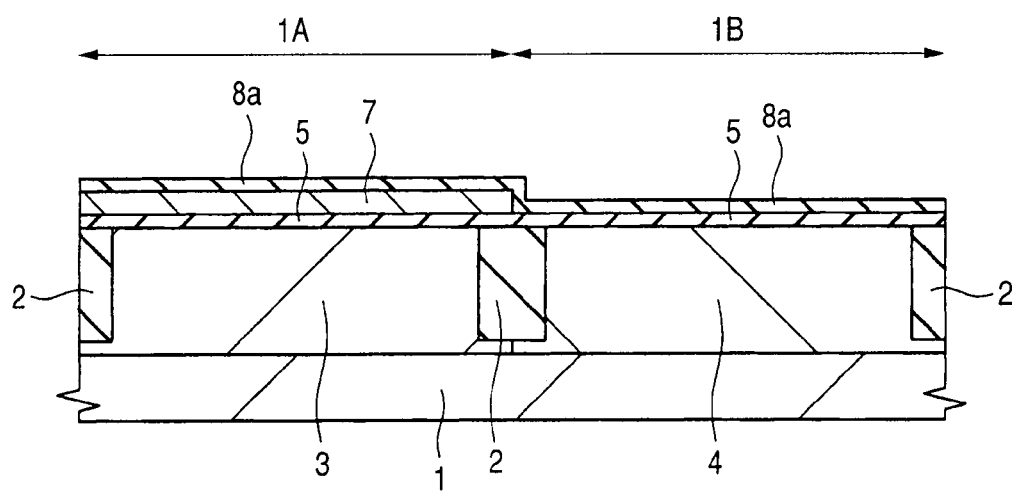
FIG. 26 is a cross-sectional view of a main part of the semiconductor device in a manufacturing step following the step shown in FIG. 25.

Then, as shown in FIG. 26, the threshold adjustment film (first metal-containing film) 8a is formed over the main surface of the semiconductor substrate 1 (in step S9a shown in FIG. 22). In the wet etching process at step S7a, the metal nitride film 7 in the pMIS formation region 1B is removed, and the metal nitride film 7 in the nMIS formation region 1A remains. In step S9a, the threshold adjustment film 8a is formed on the Hf-containing insulating film 5 in the pMIS formation region 1B, and is formed on the metal nitride film 7 in the nMIS formation region 1A.

In order to decrease the absolute value of the threshold of the p-channel MISFET (corresponding to the p-channel MISFET Qp) formed in the pMIS formation region 1B, the threshold adjustment film 8a contains a metal element (first metal element) to be introduced into the Hf-based gate insulating film of the p-channel MISFET (corresponding to the p-channel MISFET Qp). That is, the metal element is at least one kind of Al, Ta, and Ti (especially preferably Al).

Thus, the threshold adjustment film 8a contains at least one kind of Al (aluminum), Ta (tantalum), and Ti (titanium), and more preferably Al (aluminum). The metal oxide film is preferable as the threshold adjustment film 8a. The threshold adjustment film 8a is preferably an aluminum oxide film (typified by an $Al_2O_3$ film), a tantalum oxide film (typified by a $Ta_2O_5$ film), or a titanium oxide film (typified by a $TiO_2$ film), and more preferably an aluminum oxide film. The metal element contained in the threshold adjustment film 8a is hereinafter indicated by "Me". When the threshold adjustment film 8a is the aluminum oxide film, the Me is Al (Me=Al). When the threshold adjustment film 8a is the tantalum oxide film, the Me is Ta (Me=Ta). When the threshold adjustment film 8a is the titanium oxide film, the Me is Ti (Me=Ti). The forming method and thickness of the threshold adjustment film 8a can be the same as those of the threshold adjustment film 8 of the first embodiment.

Then, the same heat treatment as that performed in step S10 of the first embodiment is applied to the semiconductor substrate 1 (in step S10a shown in FIG. 22). The Hf-containing insulating film 5 reacts with the threshold adjustment film 8a in the pMIS formation region 1B by the heat treatment in step S10a. That is, the metal element Me included in the threshold adjustment film 8a (at least one kind of Al, Ta, and Ti, especially preferably, Al) is introduced (diffused) into the Hf-containing insulating film 5 by the heat treatment in step S10a.

Since the threshold adjustment film 8a is in contact with the Hf-containing insulating film 5 in the pMIS formation region 1B, the threshold adjustment film 8a reacts with the Hf-containing insulating film 5 in the heat treatment process at step S10a. As a result, the metal element Me of the threshold adjustment film 8a is introduced (diffused) into the Hf-containing insulating film 5. In contrast, since the threshold adjustment film 8a does not contact with the Hf-containing insulating film 5 with the metal nitride film 7 intervening therein in the nMIS formation region 1A, the threshold adjustment film 8a does not react with the Hf-containing insulating film 5. As a result, the metal element Me of the threshold adjustment film 8a is not introduced (diffused) into the Hf-containing insulating film 5.

Figure 27:
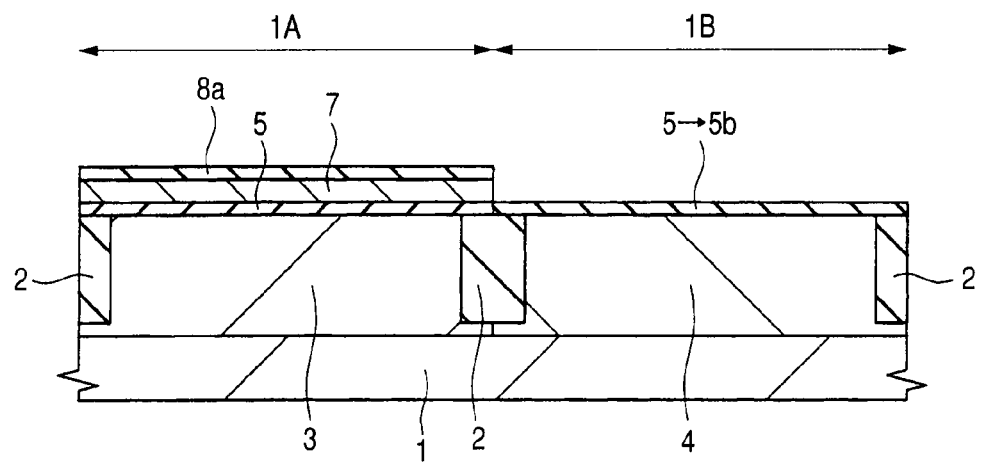
FIG. 27 is a cross-sectional view of a main part of the semiconductor device in a manufacturing step following the step shown in FIG. 26.

As shown in FIG. 27, the threshold adjustment film 8a reacts (mixed) with the Hf-containing insulating film 5 in the pMIS formation region 1B, so that the "Hf and Me containing insulating film 5b" is formed. That is, in the pMIS formation region 1B, the metal element Me of the threshold adjustment film 8a is introduced into the Hf-containing insulating film 5, so that the Hf-containing insulating film 5 is converted into the Hf and Me containing insulating film 5b.

The Hf and Me containing insulating film 5b is made of an insulating film containing Hf (hafnium) and metal element Me (which is at least one of Al, Ta, and Ti, preferably, Al). The metal element Me included in the Hf and Me containing insulating film 5b is the same as the metal element Me included in the threshold adjustment film 8a.

The specific structure (composition) of the Hf-containing insulating film 5 in the nMIS formation region 1A obtained after the heat treatment in step S10a of this embodiment is substantially the same as that of the Hf-containing insulating film 5 in the pMIS formation region 1B obtained after the heat treatment in step S10 of the first embodiment. Thus, a description thereof will be omitted. The specific structure (composition) of the Hf and Me containing insulating film 5b in the pMIS formation region 1B after the heat treatment in step S10a of this embodiment is one obtained by replacing the rare-earth element Ln of the Hf and Ln containing insulating film 5a in the nMIS formation region 1A after the heat treatment in step S10 of the first embodiment, by the metal Me. The detailed description thereof will be omitted below. When the Hf-containing insulating film 5 is a HfSiON film by way of example, the Hf and Me containing insulating film 5b is a HfMeSiON film (for Me=Al, a HfAlSiON film).

Figure 28:
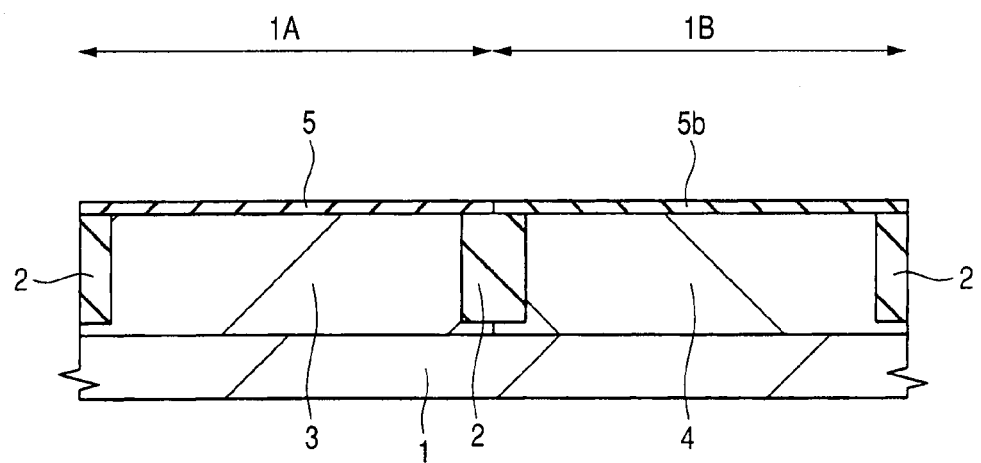
FIG. 28 is a cross-sectional view of a main part of the semiconductor device in a manufacturing step following the step shown in FIG. 27.

Then, as shown in FIG. 28, the threshold adjustment film 8a (unreacted threshold adjustment film 8a) not reacted in the heat treatment process at step S10a is removed by wet etching (in step S11a shown in FIG. 22). An etching solution used in the wet etching process of the threshold adjustment film 8a at step S11a is the same as that used in the wet etching of the threshold adjustment film 8 in step S11 of the first embodiment. In the wet etching process of the threshold adjustment film 8a at step S11a, in the nMIS formation region 1A, the threshold adjustment film 8a is removed to expose the metal nitride film 7, while in the pMIS formation region 1B, the threshold adjustment film 8a not completely reacting with the Hf-containing insulating film 5 in the heat treatment at step S10a is removed to expose the Hf and Me containing insulating film 5b.

Then, the metal nitride film 7 is removed by wet etching (in step S12 shown in FIG. 22). Thus, the structure shown in FIG. 28 is obtained. The etching solution used in the wet etching process of the metal nitride film 7 at step S12a is the same as that used in the wet etching process of the metal nitride film 7 at step S12 of the first embodiment. In the wet etching process at step S12a, the metal nitride film 7 formed in the nMIS formation region 1A is removed to expose the Hf-containing insulating film 5 in the nMIS formation region 1A. After the wet etching process of the metal nitride film 7 in step S12a, both of the Hf-containing insulating film 5 in the nMIS formation region 1A and the Hf and Me containing insulating film 5b in the pMIS formation region 1B are exposed.

Figure 29:
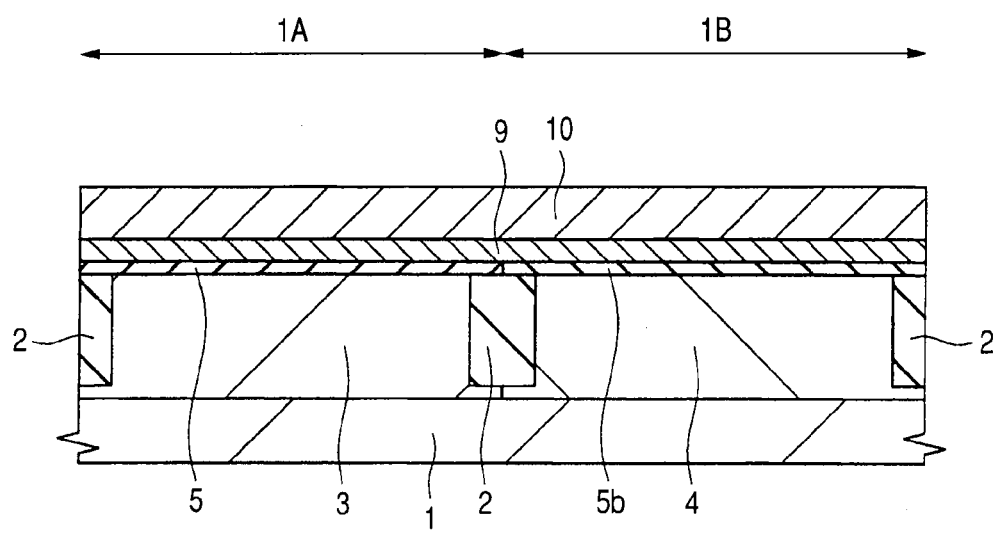
FIG. 29 is a cross-sectional view of a main part of the semiconductor device in a manufacturing step following the step shown in FIG. 28.
Figure 30:
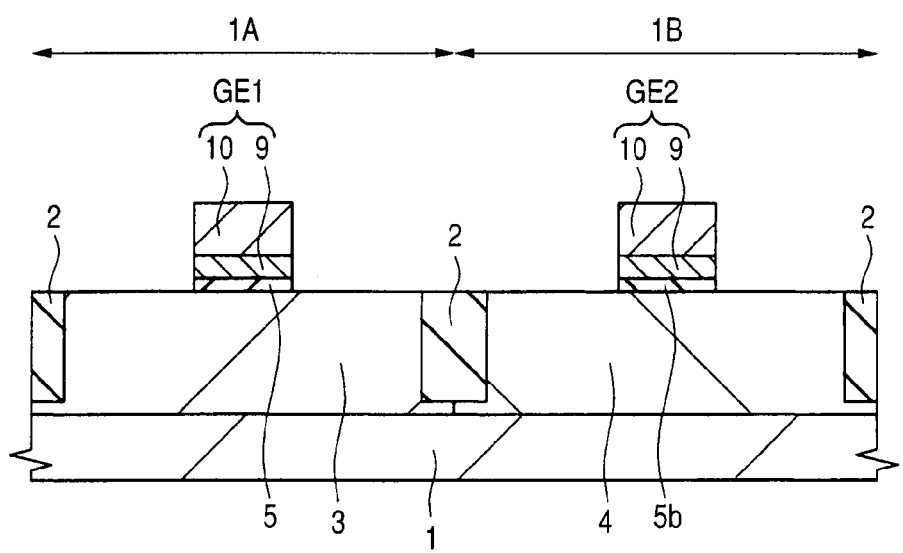
FIG. 30 is a cross-sectional view of a main part of the semiconductor device in a manufacturing step following the step shown in FIG. 29.

The following process is the same as that of the first embodiment. That is, like the first embodiment, as shown in FIG. 29, a metal film 9 is formed over the main surface of the semiconductor substrate 1 (in step S13 shown in FIG. 22), and a silicon film 10 is formed on the metal film 9 (in step S14 shown in FIG. 22). Like the first embodiment, as shown in FIG. 30, a stacked film of the silicon film 10 and the metal film 9 is patterned to form gate electrodes GE1 and GE2 (in step S15 shown in FIG. 22).

The gate electrode GE1 is formed on the Hf-containing insulating film 5 in the nMIS formation region 1A, and the gate electrode GE2 is formed on the Hf and Me containing insulating film 5b in the pMIS formation region 1B. That is, the gate electrode GE1 comprised of the metal film 9 and the silicon film 10 on the metal film 9 is formed over the surface of the p-type well 3 in the nMIS formation region 1A via the Hf-containing insulating film 5 as the gate insulating film. The gate electrode GE2 comprised of the metal film 9 and the silicon film 10 on the metal film 9 is formed over the surface of the n-type well 4 in the pMIS formation region 1B via the Hf and Me containing insulating film 5b as the gate insulating film. Both of the Hf-containing insulating film 5 and the Hf and Me containing insulating film 5b have a dielectric constant higher than that of silicon oxide.

The Hf and Me containing insulating film 5b serving as the gate insulating film of the p-channel MISFET Qp has a metal element Me content higher than that in the Hf-containing insulating film 5 serving as the gate insulating film of the n-channel MISFET Qn. This is because in the heat treatment process at step S10a, the metal element Me is introduced into the Hf-containing insulating film 5 in the pMIS formation region 1B (to become the Hf and Me containing insulating film 5b), and the metal element Me is not introduced into the Hf-containing insulating film 5 in the nMIS formation region 1A. Thus, the metal element Me content in the Hf and Me containing insulating film 5b in the pMIS formation region 1B (that is, the gate insulating film of the p-channel MISFET Qp) is higher than the metal element Me content in the Hf-containing insulating film 5 in the nMIS formation region 1A (that is, the gate insulating film of the n-channel MISFET Qn). In deposition of the Hf-containing insulating film at step S4, the Hf-containing insulating film 5 is preferably controlled not to contain Al, Ta, and Ti. Thus, the Hf-containing insulating film 5 serving as the gate insulating film of the n-channel MISFET Qn can be in the state without Al, Ta, and Ti.

The following steps after the formation of the gate electrodes GE1 and GE2 are the same as those of the first embodiment, and thus the illustration and description thereof will be omitted below.

In the first embodiment, the use of the Hf-containing insulating film 5 as the gate insulating film of the p-channel MISFET Qp, and the use of the Hf and Ln containing insulating film 5a as the gate insulating film of the n-channel MISFET Qn lowers the threshold of the n-channel MISFET Qn. In contrast, in this embodiment, the use of the Hf-containing insulating film 5 as the gate insulating film of the n-channel MISFET Qn, and the use of the Hf and Me containing insulating film 5b as the gate insulating film of the p-channel MISFET Qp can lower the threshold of the p-channel MISFET Qp. That is, the absolute value of the threshold (threshold voltage) of the p-channel MISFET Qp can be lowered. The effects of this embodiment other than the above-mentioned one are the same as those of the first embodiment, and thus the description thereof will be omitted. The effects different from those of the first embodiment will be described below.

For example, when the titanium nitride is used for the metal gate electrode, and the Hf-based gate insulating film (a high-dielectric-constant film containing Hf) is used as the gate insulating film, the metal gate electrode has an original work function of about 4.7 to 4.8 eV. Further, by introducing Al, Ta, Ti, or the like (especially, Al) into the Hf-based gate insulating film, a work function of the metal gate electrode comprised of the titanium nitride can be controlled to about 4.8 to 5.1 eV. When in the p-channel MISFET the work function of the gate electrode includes a value close to the valence band of silicon (of near 5.15 eV), the threshold voltage of the p-channel MISFET can be decreased. In this embodiment, the Hf and Ln containing insulating film 5b is used as the gate insulating film of the p-channel MISFET Qp. This embodiment can decrease and bring the effective work function of the metal film 9 closer to the valence band of silicon, as compared to the case of using the Hf-containing insulating film 5 in the gate insulating film of a p-channel MISFET Qp unlike this embodiment. Thus, this embodiment can lower the threshold of the p-channel MISFET Qp.

For example, the Hf and Ln containing insulating film 5b is used as the gate insulating film of the p-channel MISFET Qp in this embodiment. This embodiment can lower the absolute value of the threshold of the p-channel MISFET Qp by 0.1 to 0.3 V as compared to the case of using the same Hf-containing insulating film 5 as the gate insulting film of the n-channel MISFET Qn, in the gate insulating film of the p-channel MISFET Qp unlike this embodiment.

In order to obtain such an effect of reducing the threshold of the p-channel MISFET Qp, the threshold adjustment film 8a contains at least one kind of Al, Ta, and Ti (preferably, Al), and is preferably an aluminum oxide film, a tantalum oxide film, or a titanium oxide film, and especially preferably an aluminum oxide film. Since the Hf and Ln containing insulating film 5b contains at least one kind of Al (aluminum), Ta (tantalum), and Ti (titanium), especially preferably, Al (aluminum), the threshold of the p-channel MISFET Qp can surely be decreased.

The degree of reduction in threshold of the p-channel MISFET Qp can be controlled by the thickness of the threshold adjustment film 8 formed in the above step S9a, the temperature of heat treatment in the above step S10a, and the like. Thus, the thickness of the threshold adjustment film 8a formed in step S9a and/or the temperature of heat treatment in step S10a can be set according to a desired threshold of the p-channel MISFET Qp.

Third Embodiment

Figure 31:
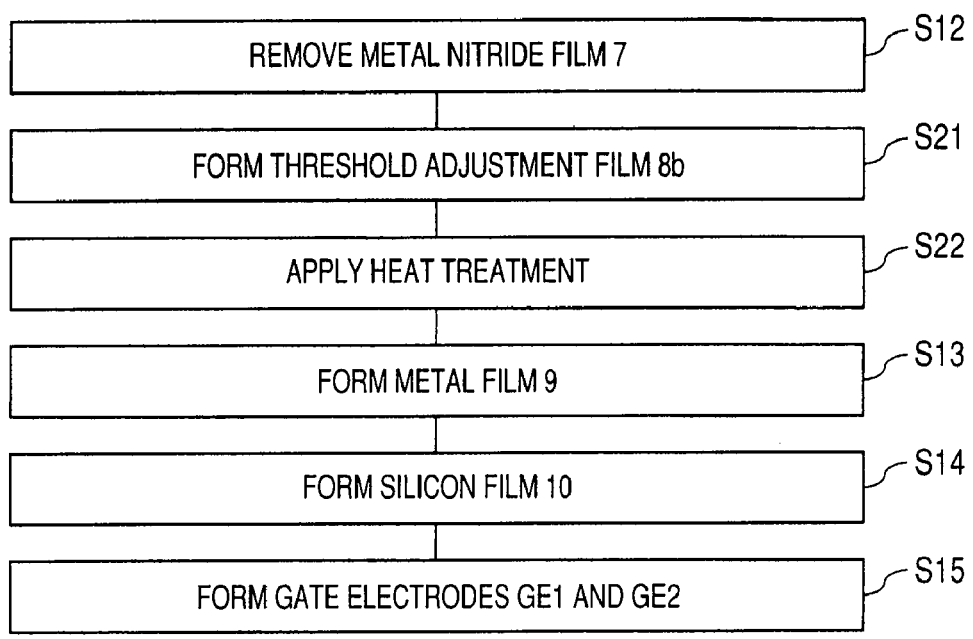
FIG. 31 is a manufacturing process flowchart showing parts of a manufacturing process of a semiconductor device according to a further embodiment of the invention.

FIG. 31 is a manufacturing process flow chart showing parts of a manufacturing process of a semiconductor device according to a third embodiment of the invention, and corresponds to FIG. 1 of the first embodiment. FIGS. 32 to 35 are cross-sectional views of main parts of the semiconductor device during respective manufacturing steps in the third embodiment of the invention.

The manufacturing process of this embodiment is the same as that of the first embodiment until the step of wet-etching the metal nitride film 7 in step S12, and a description thereof will be omitted below. Steps following the removal of the metal nitride film 7 in step S12 will be described below.

Figure 32:
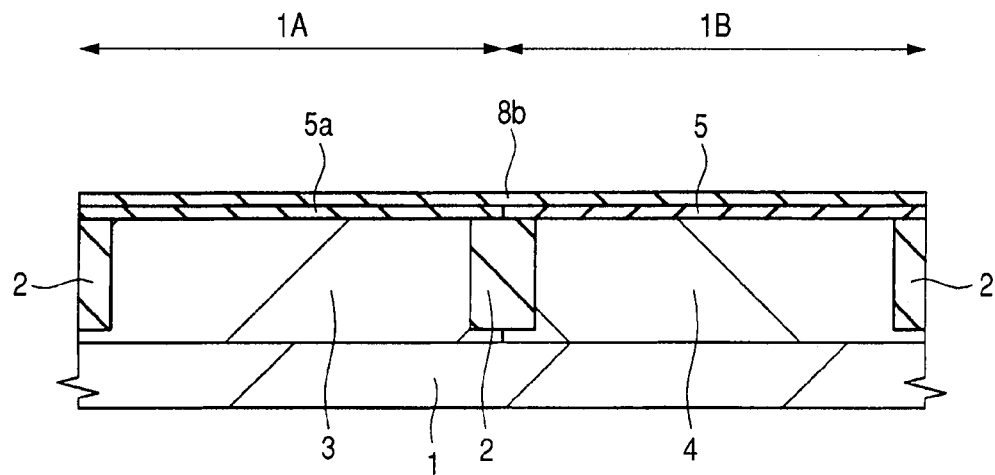
FIG. 32 is a cross-sectional view of a main part of the semiconductor device in a manufacturing step of the semiconductor device in the further embodiment of the invention.

The same processes shown in steps S1 to S12 of the first embodiment are performed to obtain the structure shown in FIG. 11. Then, in this embodiment, as shown in FIG. 32, a threshold adjustment film 8b is formed over the main surface of the semiconductor substrate 1 (in step S21 shown in FIG. 31).

The threshold adjustment film 8b can be formed of the same material as that of the threshold adjustment film 8a of the second embodiment, and can have the same forming method and thickness as those of the threshold adjustment film 8a of the second embodiment. After both of the Hf and Ln containing insulating film 5a in the nMIS formation region 1A and the Hf-containing insulating film 5 in the pMIS formation region 1B are exposed by the removing step of the metal nitride film 7 in step S12, the threshold adjustment film 8b is formed in step S21. Thus, the threshold adjustment film 8b is formed on the Hf ad Ln containing insulating film 5a in the nMIS formation region 1A, and on the Hf-containing insulating film 5 in the pMIS formation region 1B.

In order to decrease the absolute value of the threshold of the p-channel MISFET (corresponding to the p-channel MISFET Qp) formed in the pMIS formation region 1B, the threshold adjustment film 8b contains a metal element (second metal element) to be introduced into the Hf-based gate insulating film of the p-channel MISFET (corresponding to the p-channel MISFET Qp). That is, the metal element is at least one kind of Al, Ta, and Ti (especially preferably, Al).

Thus, the threshold adjustment film 8b contains at least one kind of Al (aluminum), Ta (tantalum), and Ti (titanium), and preferably Al (aluminum). The threshold adjustment film 8b is preferably a metal oxide film, and preferably an aluminum oxide film (typified by $Al_2O_3$ film), a tantalum oxide film (typified by $Ta_2O_5$ film), or a titanium oxide film (typified by $TiO_2$ film), and more preferably, an aluminum oxide film. The metal element contained in the threshold adjustment film 8b is hereinafter indicated by "Me'". When the threshold adjustment film 8b is the aluminum oxide film, the Me' is Al (Me'=Al). When the threshold adjustment film 8b is the tantalum oxide film, the Me' is Ta (Me'=Ta). When the threshold adjustment film 8b is the titanium oxide film, the Me' is Ti (Me'=Ti).

Then, heat treatment is applied to the semiconductor substrate 1 (in step S22 shown in FIG. 31). The heat treatment process can be performed in step S22, for example, at a heat treatment temperature in a range of 600 to 1000° C. under inert gas atmosphere.

In the heat treatment at step S22, in the pMIS formation region 1B, the threshold adjustment film 8b and the Hf-containing insulating film 5 are in contact with each other, and then reacted together. Thus, the metal element Me' of the threshold adjustment film 8b is introduced (diffused) into the Hf-containing insulating film 5. And, in the nMIS formation region 1A, the threshold adjustment film 8b and the Hf and Ln containing insulating film 5a are in contact with each other and then reacted together. Thus, the metal element Me' of the threshold adjustment film 8b is introduced (diffused) into the Hf and Ln containing insulating film 5a.

Figure 33:
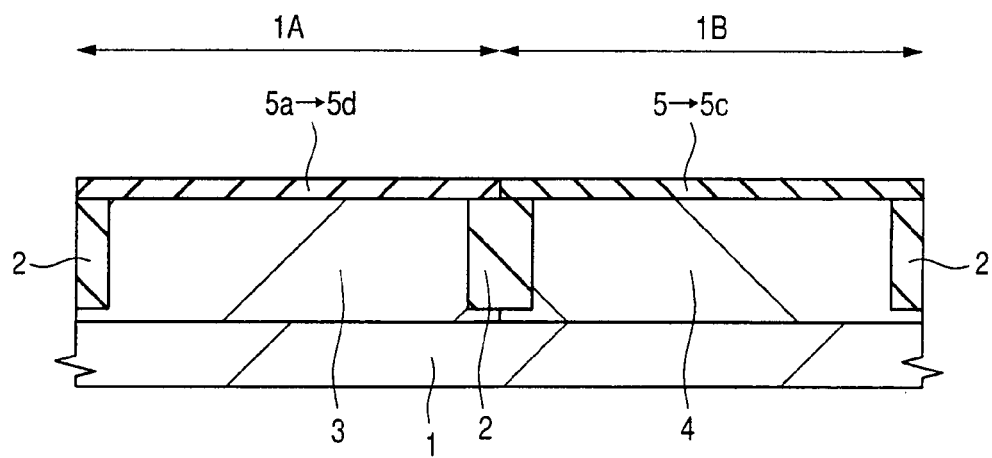
FIG. 33 is a cross-sectional view of a main part of the semiconductor device in a manufacturing step following the step shown in FIG. 32.

As shown in FIG. 33, the threshold adjustment film 8b reacts (mixed) with the Hf-containing insulating film 5 in the pMIS formation region 1B in the heat treatment shown in step S22 to form the "Hf and Me' containing insulating film 5c". That is, in the pMIS formation region 1B, the metal element Me' of the threshold adjustment film 8b (preferably, at least one kind of Al, Ta, and Ti, especially preferably, Al) is introduced into the Hf-containing insulating film 5, so that the Hf-containing insulating film 5 is converted into the Hf and Me' containing insulating film 5c.

As shown in FIG. 33, the threshold adjustment film 8b reacts (mixed) with the Hf and Ln containing insulating film 5a in the nMIS formation region 1A in the heat treatment at step S22 to form the "Hf, Ln, and Me' containing insulating film 5d". That is, in the nMIS formation region 1A, the metal element Me' of the threshold adjustment film 8b (preferably, at least one kind of Al, Ta, and Ti, more preferably, Al) is introduced into the Hf and Ln containing insulating film 5a, so that the Hf and Ln containing insulating film 5a is converted into the Hf, Ln, and Me' containing insulating film 5d.

The Hf and Me' containing insulating film 5c is comprised of insulating material containing Hf (hafnium) and a metal element Me'. The metal element Me' included in the Hf and Me' containing insulating film 5c is the same as the metal element Me' included in the threshold adjustment film 8b. The Hf, Ln, and Me' containing insulating film 5d is comprised of Hf (hafnium), a rare-earth element Ln, and a metal element Me'. The rare-earth element Ln included in Hf, Ln, and Me' containing insulating film 5d is the same as the rare-earth element Ln included in the threshold adjustment film 8. The metal element Me' included in the Hf, Ln, and Me' containing insulating film 5d is the same as the metal element Me' included in the threshold adjustment film 8b. When the Hf-containing insulating film 5 is a HfSiON film by way of example, the Hf and Me' containing insulating film 5c is a HfMe'SiON film (for Me'=Al, a HfAlSiON film). The Hf, Ln, and Me' insulating film 5d is the HfLnMe'SiON film (for Ln=La, and Me'=Al, a HfLaAlSiON film).

Figure 34:
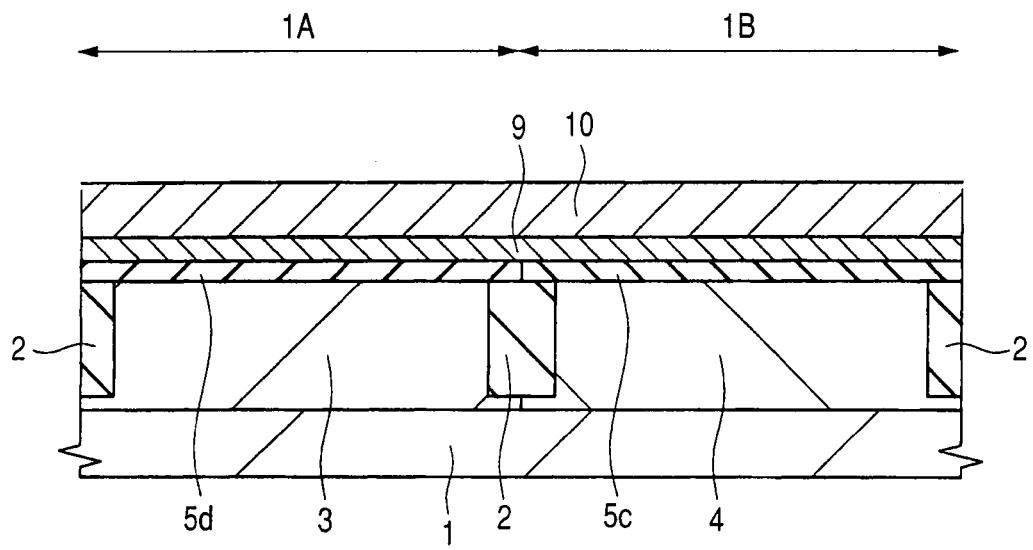
FIG. 34 is a cross-sectional view of a main part of the semiconductor device in a manufacturing step following the step shown in FIG. 33.
Figure 35:
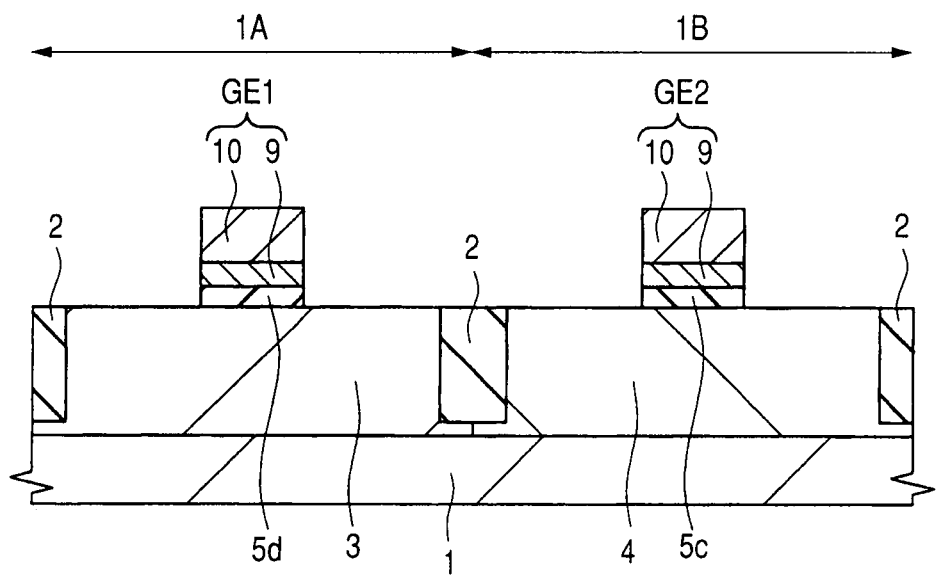
FIG. 35 is a cross-sectional view of a main part of the semiconductor device in a manufacturing step following the step shown in FIG. 34.

The following steps are the same as those of the first embodiment. That is, like the above first embodiment, as shown in FIG. 34, a metal film 9 is formed over the main surface of the semiconductor substrate 1 (in step S13 shown in FIG. 31), and a silicon film 10 is formed on the metal film 9 (in step S14 shown in FIG. 31). Then, like the first embodiment, as shown in FIG. 35, the stacked film of the silicon film 10 and the metal film 9 is patterned to form the gate electrodes GE1 and GE2 (in step S15 shown in FIG. 31).

The gate electrode GE1 is formed on the Hf, Ln, and Me' containing insulating film 5d in the nMIS formation region 1A. The gate electrode GE2 is formed on the Hf and Me' containing insulating film 5c in the pMIS formation region 1B. That is, the gate electrode GE1 comprised of the metal film 9 and the silicon film 10 on the metal film 9 is formed over the surface of the p-type well 3 in the nMIS formation region 1A via the Hf, Ln, and Me' containing insulating film 5d as the gate insulating film. The gate electrode GE2 comprised of the metal film 9 and the silicon film 10 on the metal film 9 is formed over the surface of the n-type well 4 in the pMIS formation region 1B via the Hf and Me' containing insulating film 5c as the gate insulating film. Each of the Hf, Ln, and Me' containing insulating film 5d and the Hf and Me' containing insulating film 5c has a dielectric constant higher than that of silicon oxide.

The Hf, Ln, and Me' containing insulating film 5d serving as the gate insulating film for the n-channel MISFET Qn has a rare-earth element Ln content higher than that of the Hf and Me' containing insulating film 5c serving as the gate insulating film for the p-channel MISFET Qp. This is based on the following reason. In the heat treatment at step S10, the rare-earth element Ln is introduced into the Hf-containing insulating film 5 in the nMIS formation region 1A (a part to become the Hf, Ln, and Me' containing insulating film 5d to be described later). No rare-earth element Ln is introduced into the Hf-containing insulating film 5 (a part to become the Hf and Me' containing insulating film 5c to be described later) in the pMIS formation region 1B. In depositing the Hf-containing insulating film 5 at step S4, the Hf-containing insulating film 5 does not preferably contain a rare-earth element. Thus, the Hf and Me' containing insulating film 5c serving as the game insulating film of the p-channel MISFET Qp can be in the state without any rare-earth element.

Steps following the formation of the gate electrodes GE1 and GE2 are the same as those of the first embodiment, and the illustration and description thereof will be omitted below.

This embodiment will describe the case where the heat treatment at step S22 is performed after the forming process of the threshold adjustment film 8b in step S21 and before the forming process of the metal film 9 at step S13. Alternatively, the heat treatment process at step S22 can be performed after the forming process of the metal film 9 in step S13. For example, an annealing process (activation anneal, heat treatment) for activating impurities introduced by ion-implantation for forming the n$^+$-type semiconductor region 11b and the p$^+$-type semiconductor region 12b can also work as the heat treatment in step S22. In this case, the metal film 9 is formed on the threshold adjustment film 8b in step S13. During the steps S13 to S15, the Hf-containing insulating film 5 in the pMIS formation region 1B, and the Hf and Ln containing insulating film 5a in the nMIS formation region 1A do not react with the threshold adjustment film 8b. In the activation annealing after the formation of the gate electrodes GE1 and GE2, in the pMIS formation region 1B, the Hf-containing insulating film 5 reacts with the threshold adjustment film 8b to form the Hf and Me' containing insulating film 5c, and in the nMIS formation region 1A, the Hf and Ln containing insulating film 5a reacts with the threshold adjustment film 8b to form the Hf, Ln, and Me' containing insulating film 5d.

In the first embodiment, the use of the Hf-containing insulating film 5 as the gate insulating film of the p-channel MISFET Qp, and the use of the Hf and Ln containing insulating film 5a as the gate insulating film of the n-channel MISFET Qn lowers the threshold of the n-channel MISFET Qn. In contrast, in this embodiment, the Hf, Ln, and Me' containing insulating film 5d is used for the gate insulating film of the n-channel MISFET Qn, and the Hf and Me' containing insulating film 5c is used as the gate insulating film of the p-channel MISFET Qp. In this embodiment, the Hf and Me' containing insulating film 5c is used as the gate insulating film of the p-channel MISFET Qp thereby to lower the threshold of the p-channel MISFET Qp. That is, the absolute value of the threshold (threshold voltage) of the p-channel MISFET Qp can be lowered. The reason for this is the same as the reason why the threshold of the p-channel MISFET Qp can be lowered in the second embodiment.

In contrast, in this embodiment the metal element Me' is included in the gate insulating film of the n-channel MISFET Qn. The effective work function of the metal film 9 of the gate electrode GE1 of the n-channel MISFET Qn in this embodiment is increased as compared to the above first embodiment using the Hf and Ln containing insulating film 5a in the gate insulating film of the n-channel MISFET Qn. Thus, the absolute value of the threshold voltage of the n-channel MISFET Qn is increased by the increase in work function. However, in this embodiment, the gate insulating film (Hf, Ln, and Me' containing insulating film 5d) of the n-channel MISFET Qn contains the rare-earth element Ln (especially preferably, La), whereby the absolute value of the threshold (threshold voltage) of the n-channel MISFET Qn can be lowered as compared to the case of a gate insulating film not containing the rare-earth element Ln. Thus, both n-channel MISFET Qn and p-channel MISFET Qp can lower the absolute value of the threshold (threshold voltage). The threshold of the n-channel MISFET Qn can be adjusted by adjusting the thickness of the threshold adjustment film 8. Further, the threshold of the p-channel MISFET Qp can be adjusted by adjusting the thickness of the threshold adjustment film 8b. Thus, the gate electrodes GE1 and GE2 having excellent symmetry property with a midgap as a basic point can be formed. A difference between the absolute value of the threshold of the n-channel MISFET Qn and the absolute value of the threshold of the p-channel MISFET Qp can be made small, which can achieve the semiconductor device with a CMISFET having excellent symmetry property. For example, when using a lanthanum film of 1 nm in thickness as the threshold adjustment film 8, and also using an aluminum oxide film of 0.5 nm in thickness as the threshold adjustment film 8b, the effective work function of the gate electrode GE1 (metal film 9) of the n-channel MISFET Qn is about 4.2 eV, and the effective work function of the gate electrode GE2 (metal film 9) of the p-channel MISFET Qp can be about 4.9 eV.

The effects of this embodiment other than the above-mentioned one are the same as those of the first embodiment, and a description thereof will be omitted below.

Fourth Embodiment

Figure 36:
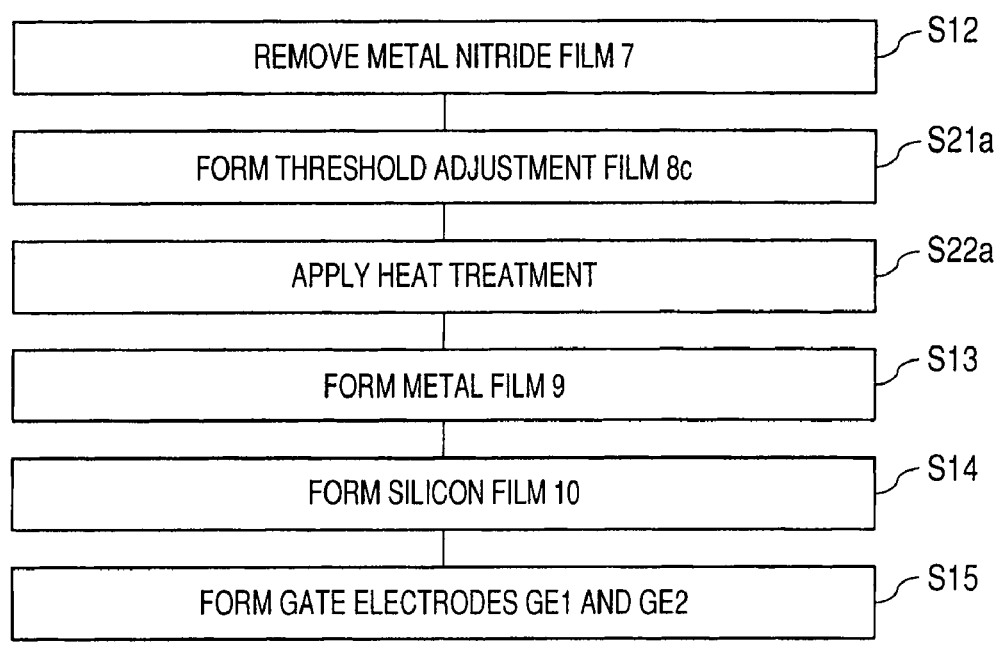
FIG. 36 is a manufacturing process flowchart showing parts of a manufacturing process of a semiconductor device according to a still further embodiment of the invention.

FIG. 36 is a manufacturing process flow chart showing parts of a manufacturing process of a semiconductor device according to a fourth embodiment of the invention, and corresponds to FIG. 1 of the first embodiment. FIGS. 37 to 40 are cross-sectional views of main parts of the manufacturing process of the semiconductor device according to the fourth embodiment.

The manufacturing process of this embodiment is the same as that of the second embodiment until the step of removing the metal nitride film 7 by wet etching in step S12a, and a description thereof will be omitted below. Steps following the removal of the metal nitride film 7 in step S12a will be described below.

Figure 37:
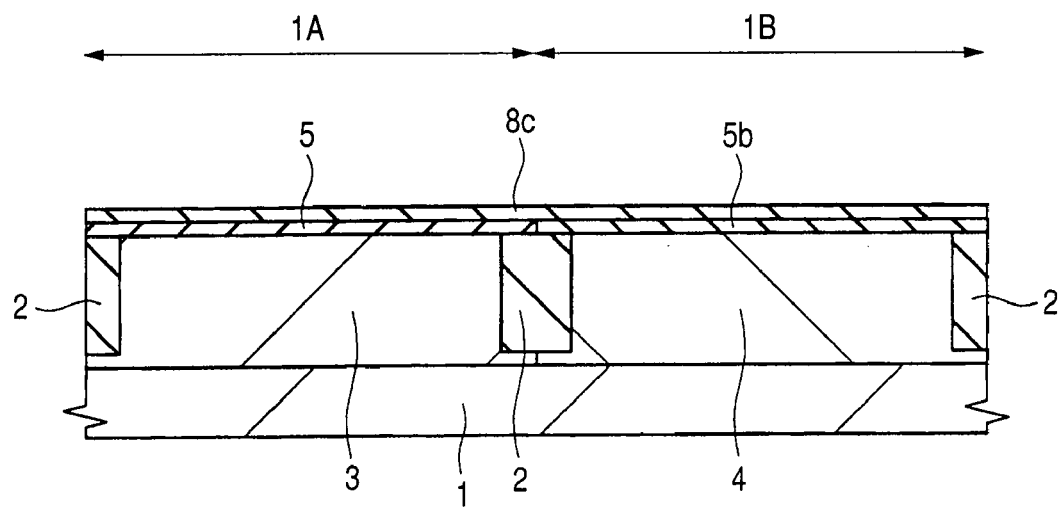
FIG. 37 is a cross-sectional view of a main part of the semiconductor device in a manufacturing step in the still further embodiment of the invention.

The same processes as those of steps S1 to S12a in the second embodiment are performed to obtain the structure shown in FIG. 28. In this embodiment, as shown in FIG. 37, a threshold adjustment film 8c is formed over the main surface of the semiconductor substrate 1 (in step S21a shown in FIG. 36).

The threshold adjustment film 8c can be formed of the same material as that of the threshold adjustment film 8 of the first embodiment, and a formation method and thickness of the threshold adjustment film 8c can be the same as those of the threshold adjustment film 8 of the first embodiment. The threshold adjustment film 8c is formed in step S21a after both the Hf and Me containing insulting film 5b in the pMIS formation region 1B and the Hf-containing insulating film 5 in the nMIS formation region 1A are exposed in the removing step of the metal nitride film 7 in step S12a. Then, the threshold adjustment film 8c is formed on the Hf and Me containing insulating film 5b in the pMIS formation region 1B, and on the Hf-containing insulating film 5 in the nMIS formation region 1A.

The threshold adjustment film 8c contains a metal element (second metal element), namely, a rare-earth element (especially preferably, La), to be introduced into the Hf-based gate insulating film of the n-channel MISFET (corresponding to the n-channel MISFET Qn) so as to decrease the absolute value of the threshold of the n-channel MISFET (corresponding to the n-channel MISFET Qn) formed in the nMIS formation region 1A.

Thus, the threshold adjustment film 8c contains the rare-earth element, especially preferably, La (lanthanum). Since the threshold adjustment film 8c is preferably a metal oxide film, the threshold adjustment film 8c is preferably a rare-earth oxide film (oxidized rare-earth film), especially preferably, a lanthanum oxide film (typified by $La_2O_3$ film as the lanthanum oxide film). The rare-earth element contained in the threshold adjustment film 8c is hereinafter referred to as a "Ln'". When the threshold adjustment film 8c is a lanthanum oxide film, the Ln' is La (Ln'=Y). When the threshold adjustment film 8c is an yttrium oxide film, the Ln' is Y (Ln'=Y).

Then, heat treatment is applied to the semiconductor substrate 1 (in step S22a shown in FIG. 36). The heat treatment process can be performed in step S22a at a heat treatment temperature in a range of 600 to 1000° C. under inert gas atmosphere.

In the heat treatment at step S22a, in the nMIS formation region 1A, the threshold adjustment film 8c and the Hf-containing insulating film 5 are in contact with each other in the nMIS formation region 1A, and then reacted together. Thus, the rare-earth element Ln' of the threshold adjustment film 8c is introduced (diffused) into the Hf-containing insulating film 5. In the pMIS formation region 1B, the threshold adjustment film 8c and the Hf and Me containing insulating film 5b are in contact with each other, and then reacted together. Thus, the rare-earth element Ln' of the threshold adjustment film 8c is introduced (diffused) into the Hf and Me containing insulating film 5b.

Figure 38:
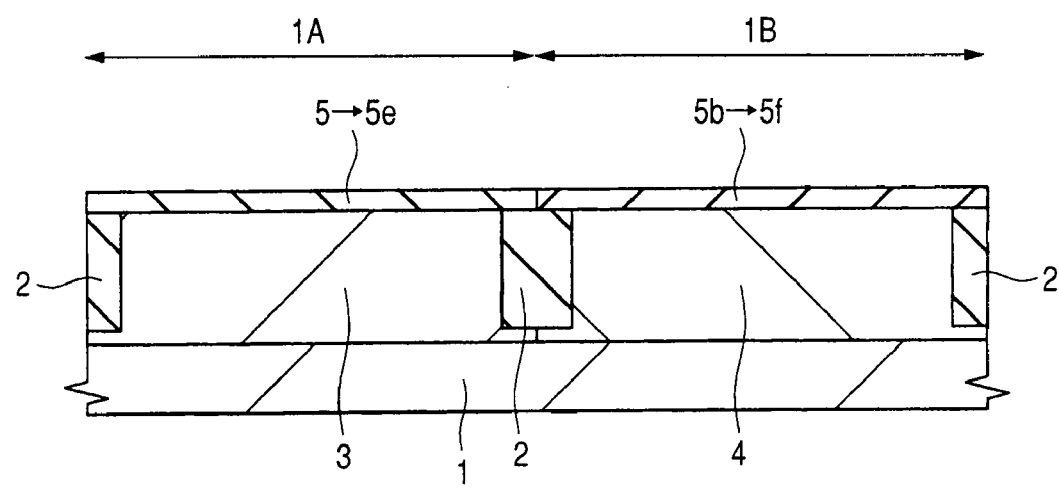
FIG. 38 is a cross-sectional view of a main part of the semiconductor device in a manufacturing step following the step shown in FIG. 37.

In the heat treatment in step S22a as shown in FIG. 38, a "Hf and Ln' containing insulating film 5e" is formed by allowing the threshold adjustment film 8c to react (mix) with the Hf-containing insulating film 5 in the nMIS formation region 1A. That is, in the nMIS formation region 1A, the rare-earth element Ln' of the threshold adjustment film 8c (especially preferably, La) is introduced into the Hf-containing insulating film 5, so that the Hf-containing insulating film 5 is converted into a Hf and Ln' containing insulating film 5e.

In the heat treatment at step S22a as shown in FIG. 38, a "Hf, Ln', and Me containing insulating film 5f" is formed by allowing the threshold adjustment film 8c to react (mix) with the Hf and Me containing insulating film 5b in the pMIS formation region 1B. That is, in the pMIS formation region 1B, the rare-earth element Ln' of the threshold adjustment film 8c (especially preferably, La) is converted into the Hf and Me containing insulating film 5b, so that the Hf and Me containing insulating film 5b is converted into the Hf, Ln', and Me containing insulating film 5f.

The Hf and Ln' containing insulating film 5e is comprised of an insulating material containing Hf (hafnium) and a rare-earth element Ln'. The rare-earth element Ln' contained in the Hf and Ln' containing insulating film 5e is the same as the rare-earth element Ln' contained in the threshold adjust film 8c. The Hf, Ln', and Me containing insulating film 5f is comprised of an insulating material containing Hf (hafnium), a rare-earth element Ln', and a metal element Me. The rare-earth element Ln' contained in the Hf, Ln', and Me containing insulating film 5f is the same as the rare-earth element Ln' contained in the threshold adjustment film 8c. The metal element Me contained in the Hf, Ln', and Me containing insulating film 5f is the same as the metal element Me contained in the threshold adjustment film 8a. When the Hf-containing insulating film 5 is a HfSiON film by way of example, the Hf and Ln' containing insulating film 5e is a HfLn'SiON film (for Ln'=La, a HfLaSiON film). A Hf, Ln', and Me containing insulating film 5f is a HfLn'MeSiON film (for Ln'=La, and Me=Al, a HfLaAlSiON film).

Figure 39:
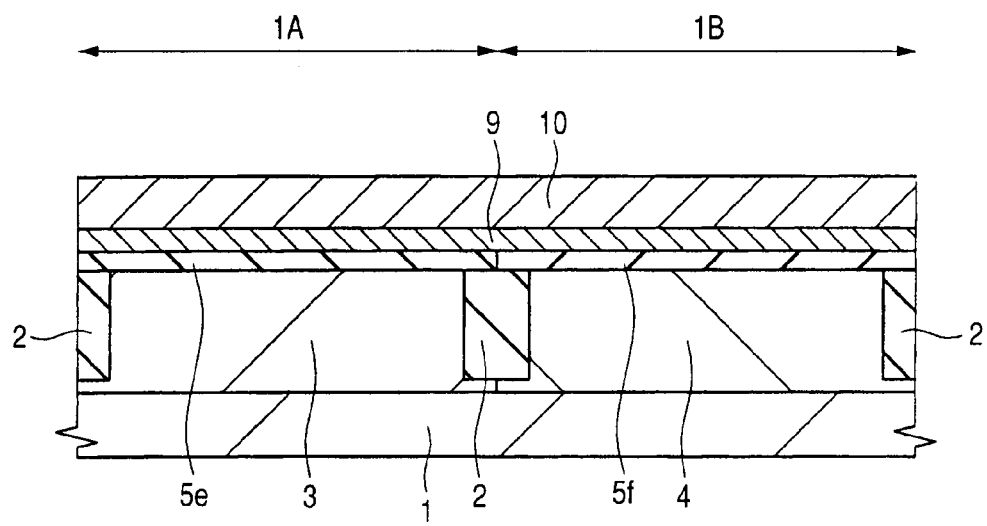
FIG. 39 is a cross-sectional view of a main part of the semiconductor device in a manufacturing step following the step shown in FIG. 38.
Figure 40:
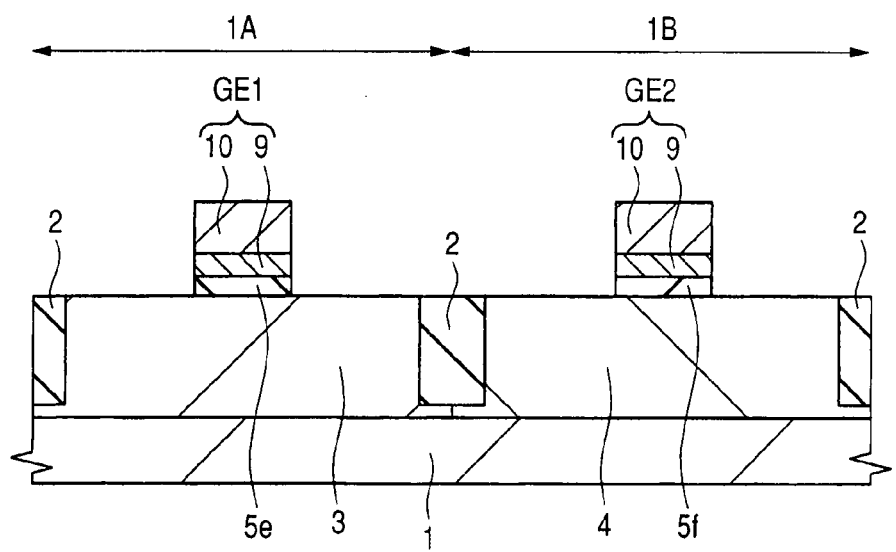
FIG. 40 is a cross-sectional view of a main part of the semiconductor device in a manufacturing step following the step shown in FIG. 39.

The following steps are the same as those of the first and second embodiments. That is, like the first and second embodiments, as shown in FIG. 39, a metal film 9 is formed over the main surface of the semiconductor substrate 1 (in step S13 shown in FIG. 36), and a silicon film 10 is formed on the metal film 9 (in step S14 shown in FIG. 36). Then, like the first embodiment, as shown in FIG. 40, a stacked film of the silicon film 10 and the metal film 9 is patterned to form gate electrodes GE1 and GE2 (in step S15 shown in FIG. 36).

The gate electrode GE1 is formed on the Hf and Ln' containing insulating film 5e in the nMIS formation region 1A. The gate electrode GE2 is formed on the Hf, Ln', and Me containing insulating film 5f in the pMIS formation region 1B. That is, the gate electrode GE1 comprised of the metal film 9 and the silicon film 10 on the metal film 9 is formed over the surface of the p-type well 3 in the nMIS formation region 1A via the Hf and Ln' containing insulating film 5e as the gate insulating film. The gate electrode GE2 comprised of the metal film 9 and the silicon film 10 on the metal film 9 is formed over the surface of the n-type well 4 in the pMIS formation region 1B via the Hf, Ln', and Me containing insulating film 5f as the gate insulating film. Each of the Hf and Ln' containing insulating film 5e and the Hf, Ln', and Me containing insulating film 5f has a dielectric constant higher than that of silicon oxide.

The Hf, Ln', and Me containing insulating film 5f serving as the gate insulating film of the p-channel MISFET Qp has a metal element Me content higher than that in the Hf and Ln' containing insulating film 5e serving as the gate insulating film of the n-channel MISFET Qn. This is based on the following reasons. In the heat treatment process at step S10a, the metal element Me is introduced into the Hf-containing insulating film 5 in pMIS formation region 1B (a part to become the Hf, Ln', and Me containing insulating film 5f to be described later). However, the metal element Me is not introduced into the Hf-containing insulating film in the nMIS formation region 1A (a part to become the Hf and Ln' containing insulating film 5e to be described later). In depositing the Hf-containing insulating film 5 at step S4, the Hf-containing insulating film 5 is preferably controlled not to contain Al, Ta, or Ti. Thus, the Hf and Ln' containing insulating film 5e serving as the gate insulating film of the n-channel MISFET Qn can be in the state without Al, Ta, and Ti.

The steps after the formation of the gate electrodes GE1 and GE2 are the same as those of the first and second embodiments, and the illustration and description thereof will be described below.

In this embodiment, the heat treatment in step S22a is performed after the forming process of the threshold adjustment film 8c in step S21a and before the forming process of the metal film 9 in step S13. Alternatively, like the heat treatment in step S22 of the third embodiment, the heat treatment in step S22a of this embodiment can also be performed after the forming process of the metal film 9 in step S13. For example, an annealing process (activation anneal, heat treatment) for activating impurities introduced by ion-implantation for forming the $n^+$-type semiconductor region 11b and the $p^+$-type semiconductor region 12b can also work as the heat treatment in step S22a. In this case, the metal film 9 is formed on the threshold adjustment film 8c in step S13. During the steps S13 to S15, the Hf-containing insulating film 5 in the nMIS formation region 1A, and the Hf and Me containing insulating film 5b in the pMIS formation region 1B do not react with the threshold adjustment film 8c. In the activation annealing after the formation of the gate electrodes GE1 and GE2, in the nMIS formation region 1A, the Hf-containing insulating film 5 reacts with the threshold adjustment film 8c to form the Hf and Ln' containing insulating film 5e. In the pMIS formation region 1B, the Hf and Me containing insulating film 5b reacts with the threshold adjustment film 8c to form the Hf, Ln', and Me containing insulating film 5f.

In the second embodiment, the Hf-containing insulating film 5 is used as the gate insulating film of the n-channel MISFET Qn, and the Hf and Me containing insulating film 5b is used as the gate insulating film of the p-channel MISFET Qp, which lowers the threshold of the p-channel MISFET Qp. On the other hand, in this embodiment, the Hf, Ln', and Me containing insulating film 5f is used as the gate insulating film of the p-channel MISFET Qp, and the Hf and Ln' containing insulating film 5e is used as the gate insulating film of the n-channel MISFET Qn. In this embodiment, the use of the Hf and Ln' containing insulating film 5e as the gate insulating film of the n-channel MISFET Qn can lower the threshold of the n-channel MISFET Qn. That is, the absolute value of the threshold (threshold voltage) of the n-channel MISFET Qn can be lowered. The reason for lowering the threshold of the n-channel MISFET Qn is the same as that of the first embodiment.

In contrast, since in this embodiment the rare-earth element Ln' is included in the gate insulating film of the p-channel MISFET Qp, the effective work function of the metal film 9 of the gate electrode GE2 of the p-channel MISFET Qp is increased as compared to the above second embodiment using the Hf and Me containing insulating film 5b in the gate insulating film of the p-channel MISFET Qp. Thus, the absolute value of the threshold voltage of the p-channel MISFET Qp is increased by the increase in work function. However, in this embodiment the gate insulating film (Hf, Ln', and Me containing insulating film 5f) of the p-channel MISFET Qp contains a metal element Me (preferably, at least one kind of Al, Ta, and Ti, especially preferably, Al). In this embodiment, the absolute value of the threshold (threshold voltage) of the p-channel MISFET Qp can be lowered as compared to the case of the gate insulating film not containing the metal element Me. Thus, both n-channel MISFET Qn and p-channel MISFET Qp can lower the absolute value of the threshold (threshold voltage). The threshold of the p-channel MISFET Qp can be adjusted by adjusting the thickness of the threshold adjustment film 8a. Further, the threshold of the n-channel MISFET Qn can be adjusted by adjusting the thickness of the threshold adjustment film 8c. Thus, the gate electrodes GE1 and GE2 having excellent symmetry property with a midgap as a basic point can be formed. A difference between the absolute value of the threshold of the n-channel MISFET Qn and the absolute value of the threshold of the p-channel MISFET Qp can be made small, which can achieve the semiconductor device with the CMISFET having excellent symmetry property.

The effects of this embodiment other than the above-mentioned one are the same as those of the second embodiment, and thus the description thereof will be omitted.

Although the invention made by the inventors have been specifically described based on the embodiments, the invention is not limited to the embodiments. It is apparent that various modifications can be made to those embodiments without departing from the scope of the invention.

The invention is effectively applied to semiconductor devices and manufacturing techniques thereof.

What is claimed is:

1. A manufacturing method of a semiconductor device, said semiconductor device including a first MISFET serving as one of an n-channel MISFET and a p-channel MISFET in a first region of a semiconductor substrate, and a second MISFET serving as the other of the n-channel MISFET and the p-channel MISFET in a second region of the semiconductor substrate, said manufacturing method comprising the steps of:
   (a) forming a first insulating film containing Hf for a gate insulating film of each of the first and second MISFETs, in the first region and the second region of the semiconductor substrate;
   (b) forming a first metal nitride film over the first insulating film formed in the first region and the second region;
   (c) removing the first metal nitride film in the first region, while leaving the first metal nitride film in the second region;
   (d) after the step (c), forming a first metal-containing film containing a first metal element to be introduced into the gate insulating film of the first MISFET, over the first insulating film in the first region and over the first metal nitride film in the second region so as to reduce a threshold of the first MISFET;
   (e) causing the first insulating film in the first region to react with the first metal-containing film by heat treatment;
   (f) after the step (e), removing an unreacted part of the first metal-containing film not reacting in the step (e);
   (g) after the step (f), removing the first metal nitride film;
   (h) after the step (g), forming a metal film over the first insulating film in the first region and the second region; and
   (i) forming a first gate electrode for the first MISFET in the first region, and a second gate electrode for the second MISFET in the second region by patterning the metal film.

2. The manufacturing method of a semiconductor device according to claim 1, wherein the step (c) comprises the steps of:
   (c1) forming a resist pattern over the first metal nitride film in the second region;
   (c2) removing the first metal nitride film in the first region by etching using the resist pattern as an etching mask to leave the first metal nitride film in the second region; and
   (c3) after the step (c2), removing the resist pattern, wherein the step (c2), the step (c3), the step (f), and the step (g) are performed by a wet process without using any one of an APM solution and a hydrofluoric acid.

3. The manufacturing method of a semiconductor device according to claim 2, wherein in the step (c3), the resist pattern is removed using an organic solvent.

4. The manufacturing method of a semiconductor device according to claim 3, wherein the first metal nitride film is a titanium nitride film, a hafnium nitride film, or a zirconium nitride film.

5. The manufacturing method of a semiconductor device according to claim 4, wherein in the step (c2) and the step (g), the first metal nitride film is etched by using an etching solution containing hydrogen peroxide and not containing ammonia and hydrofluoric acid.

6. The manufacturing method of a semiconductor device according to claim 5, further comprising, a step of, after the step (h) and before the step (i),
(h1) forming a silicon film over the metal film,
wherein in the step (i), the metal film and the silicon film over the metal film are patterned to form the first gate electrode in the first region and the second gate electrode in the second region.

7. The manufacturing method of a semiconductor device according to claim 6,
wherein the first MISFET is the n-channel MISFET,
wherein the second MISFET is the p-channel MISFET, and
wherein the first metal element is a rare-earth element.

8. The manufacturing method of a semiconductor device according to claim 7, wherein the first metal-containing film is a rare-earth oxide film.

9. The manufacturing method of a semiconductor device according to claim 8, wherein the first metal-containing film is a lanthanum oxide film.

10. The manufacturing method of a semiconductor device according to claim 6,
wherein the first MISTET is the p-channel MISFET,
wherein the second MISFET is the n-channel MISFET, and
wherein the first metal element is at least one kind of Al, Ta, and Ti.

11. The manufacturing method of a semiconductor device according to claim 10, wherein the first metal-containing film is an aluminum oxide film, a tantalum oxide film, or a titanium oxide film.

12. The manufacturing method of a semiconductor device according to claim 11, wherein the first metal-containing film is an aluminum oxide film.

13. The manufacturing method of a semiconductor device according to claim 6, wherein the metal film is a titanium nitride film, a tantalum nitride film, or a tantalum carbide film.

14. The manufacturing method of a semiconductor device according to claim 13, wherein each of the first metal nitride film and the metal film is comprised of titanium nitride.

15. The manufacturing method of a semiconductor device according to claim 1, further comprising a step of, after the step (g) and before the step (h),
(g1) forming a second metal-containing film containing a second metal element to be introduced into the gate insulating film of the second MISFET, over the first insulating film in the first region and the second region so as to reduce a threshold of the second MISFET.

16. The manufacturing method of a semiconductor device according to claim 15,
wherein the first MISFET is the n-channel MISFET,
wherein the second MISFET is the p-channel MISFET,
wherein the first metal element is a rare-earth element, and
wherein the second metal element is at least one kind of Al, Ta, and Ti.

17. The manufacturing method of a semiconductor device according to claim 16,
wherein the first metal-containing film is a lanthanum oxide film, and
wherein the second metal-containing film is an aluminum oxide film.

18. The manufacturing method of a semiconductor device according to claim 15,
wherein the first MISFET is the p-channel MISFET,
wherein the second MISFET is the n-channel MISFET,
wherein the first metal element is at least one kind of Al, Ta, and Ti, and
wherein the second metal element is a rare-earth element.

19. The manufacturing method of a semiconductor device according to claim 18,
wherein the first metal-containing film is an aluminum oxide film, and
wherein the second metal-containing film is a lanthanum oxide film.

* * * * *